United States Patent
Matsukura

(10) Patent No.: US 8,927,985 B2
(45) Date of Patent: Jan. 6, 2015

(54) SEMICONDUCTOR DEVICE

(71) Applicant: Semiconductor Energy Laboratory Co., Ltd., Atsugi (JP)

(72) Inventor: Hideki Matsukura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/027,426

(22) Filed: Sep. 16, 2013

(65) Prior Publication Data
US 2014/0077208 A1 Mar. 20, 2014

(30) Foreign Application Priority Data
Sep. 20, 2012 (JP) ................. 2012-206461

(51) Int. Cl.
*H01L 29/786* (2006.01)
*H01L 27/12* (2006.01)

(52) U.S. Cl.
CPC .......... *H01L 29/7869* (2013.01); *H01L 27/124* (2013.01); *H01L 27/1255* (2013.01)
USPC .............. 257/43; 257/E21.459; 257/E29.089; 257/E29.095; 257/E29.296; 257/E33.053

(58) Field of Classification Search
USPC ...................... 257/43, 76, E21.459, E29.089, 257/E29.095, E29.296, E33.053
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |

(Continued)

FOREIGN PATENT DOCUMENTS

| EP | 1 737 044 A1 | 12/2006 |
|---|---|---|
| EP | 2 226 847 A2 | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Matthew W Such
*Assistant Examiner* — Monica D Harrison
(74) *Attorney, Agent, or Firm* — Nixon Peabody LLP; Jeffrey L. Costellia

(57) ABSTRACT

A semiconductor device includes first and second conductive layers over an insulating surface, a first insulating layer over the first and second conductive layers, first and second oxide semiconductor layers over the first insulating layer, third and fourth conductive layers over the first oxide semiconductor layer, a second insulating layer over the third and fourth conductive layers, and a fifth conductive layer over the second insulating layer. In the semiconductor device, the third conductive layer is electrically connected to the second conductive layer, the fifth conductive layer is electrically connected to the fourth conductive layer, the first oxide semiconductor layer has a region overlapping with the first conductive layer, the second oxide semiconductor layer has a region overlapping with the fifth conductive layer, and the second oxide semiconductor layer has a region intersecting with the second conductive layer.

15 Claims, 32 Drawing Sheets

(56) References Cited

U.S. PATENT DOCUMENTS

| | | | |
|---|---|---|---|
| 6,727,522 B1 | 4/2004 | Kawasaki et al. | |
| 6,825,488 B2 | 11/2004 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,612,753 B2 | 11/2009 | Koyama | |
| 7,674,650 B2 | 3/2010 | Akimoto et al. | |
| 7,732,819 B2 | 6/2010 | Akimoto et al. | |
| 8,102,476 B2 | 1/2012 | Son et al. | |
| 8,253,135 B2 * | 8/2012 | Uochi et al. | 257/43 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113549 A1 | 6/2006 | Den et al. | |
| 2006/0113565 A1 | 6/2006 | Abe et al. | |
| 2006/0133539 A1 | 6/2006 | Sano et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0163874 A1 | 7/2010 | Koyama et al. | |
| 2011/0032435 A1 | 2/2011 | Kimura | |
| 2011/0140205 A1 | 6/2011 | Sakata et al. | |
| 2012/0052606 A1 | 3/2012 | Yamazaki | |
| 2012/0052625 A1 | 3/2012 | Yamazaki | |
| 2012/0056176 A1 | 3/2012 | Yamazaki | |
| 2012/0061664 A1 | 3/2012 | Yamazaki et al. | |
| 2012/0061665 A1 | 3/2012 | Miyake et al. | |
| 2012/0061673 A1 | 3/2012 | Yamazaki et al. | |
| 2012/0062813 A1 | 3/2012 | Koyama | |
| 2012/0062814 A1 | 3/2012 | Yamazaki et al. | |
| 2013/0240873 A1 | 9/2013 | Yamazaki et al. | |
| 2013/0270562 A1 | 10/2013 | Yamazaki | |
| 2014/0014948 A1 | 1/2014 | Matsukura | |
| 2014/0034954 A1 | 2/2014 | Yamazaki et al. | |
| 2014/0042432 A1 | 2/2014 | Yamazaki | |
| 2014/0042443 A1 | 2/2014 | Yamazaki | |
| 2014/0061636 A1 | 3/2014 | Miyake et al. | |
| 2014/0061654 A1 | 3/2014 | Yamazaki et al. | |
| 2014/0070208 A1 | 3/2014 | Yamazaki | |
| 2014/0070224 A1 | 3/2014 | Yamazaki | |

FOREIGN PATENT DOCUMENTS

| | | |
|---|---|---|
| JP | 60-198861 | 10/1985 |
| JP | 63-210022 | 8/1988 |
| JP | 63-210023 | 8/1988 |
| JP | 63-210024 | 8/1988 |
| JP | 63-215519 | 9/1988 |
| JP | 63-239117 | 10/1988 |
| JP | 63-265818 | 11/1988 |
| JP | 05-251705 | 9/1993 |
| JP | 07-104312 | 4/1995 |
| JP | 08-264794 | 10/1996 |
| JP | 11-505377 | 5/1999 |
| JP | 2000-044236 | 2/2000 |
| JP | 2000-150900 | 5/2000 |
| JP | 2002-076356 | 3/2002 |
| JP | 2002-289859 | 10/2002 |
| JP | 2003-086000 | 3/2003 |
| JP | 2003-086808 | 3/2003 |
| JP | 2004-103957 | 4/2004 |
| JP | 2004-273614 | 9/2004 |
| JP | 2004-273732 | 9/2004 |
| JP | 2005-077822 | 3/2005 |
| JP | 2011-142311 | 7/2011 |
| JP | 2012-072493 | 4/2012 |
| WO | WO-2004/114391 A1 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

(56) References Cited

OTHER PUBLICATIONS

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350°C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Waile.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-in. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure For Amorphous In-Ga-Zn-Oxide TFT,", AM-FPD '09 Digest of Technical Papers, Jul. 1, 2009, pp. 41-44.

Osada.T et al.. "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No, 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 in. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, 26, pp. 181-184.

Osada.T et al.. "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=in,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Miyasaka.M, "SUFTLA Flexible Microelectronics on Their Way to Business,", SID Digest '07: SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,",

(56) References Cited

OTHER PUBLICATIONS

SID Digest '09 : SID International Symposium.Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW'06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFe2O4, and YB2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000°C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

SEMICONDUCTOR DEVICE

BACKGROUND OF THE INVENTION

1. Field of the Invention

The technical field of the present invention relates to a semiconductor device.

2. Description of the Related Art

Patent Document 1 and Patent Document 2 each disclose a semiconductor device including a transistor whose active layer has an oxide semiconductor layer.

The active layer is a semiconductor layer having at least a channel formation region.

The channel formation region is a region in which a channel can be formed.

A paragraph [0010] in Patent Document 1 discloses the following: "impurities such as a compound containing a hydrogen atom typified by $H_2O$, a compound containing an alkali metal, or a compound containing an alkaline earth metal in the deposited oxide semiconductor film increase the carrier density of the oxide semiconductor film".

A paragraph [0010] in Patent Document 2 discloses the following: "a hydrogen element serves as a carrier (a donor) in an oxide semiconductor layer."

[Reference]

[Patent Document 1] Japanese Published Patent Application No. 2012-072493

[Patent Document 2] Japanese Published Patent Application No. 2011-142311

SUMMARY OF THE INVENTION

An object is to use efficiently a region in which an active layer is not formed.

An electrode having a semiconductor layer is preferably formed in the region in which an active layer is not formed.

Examples of the electrode include an electrode of a capacitor, an electrode of a display element, an electrode of a memory element, and an electrode of a photoelectric conversion element, but the electrode is not limited to these examples.

In the case where the active layer has an oxide semiconductor layer, it is preferable to form an electrode having an oxide semiconductor layer in the same step as the active layer having an oxide semiconductor layer, which leads to a reduction of the number of steps.

Since an oxide semiconductor layer has a light-transmitting property, an electrode having an oxide semiconductor layer is preferably formed, in which case the electrode can have a light-transmitting property.

Since the resistance value of the electrode having an oxide semiconductor layer is high, the area of the electrode having an oxide semiconductor layer is preferably large.

Since the resistance value of the electrode having an oxide semiconductor layer is high, an auxiliary wiring is preferably provided.

Since the resistance value of the electrode having an oxide semiconductor layer is high, alkali metal, alkaline earth metal, hydrogen, or the like is preferably contained in the electrode having an oxide semiconductor layer.

Alkali metal, alkaline earth metal, hydrogen, or the like can work as a carrier in the oxide semiconductor layer.

For example, it is possible to provide a semiconductor device including a first conductive layer over an insulating surface, a second conductive layer over the insulating surface, a first insulating layer over the first conductive layer and the second conductive layer, a first oxide semiconductor layer over the first insulating layer, a second oxide semiconductor layer over the first insulating layer, a third conductive layer over the first oxide semiconductor layer, a fourth conductive layer over the first oxide semiconductor layer, a second insulating layer over the third conductive layer and the fourth conductive layer, and a fifth conductive layer over the second insulating layer. In the semiconductor device, the third conductive layer is electrically connected to the second conductive layer, the fifth conductive layer is electrically connected to the fourth conductive layer, at least part of the first conductive layer has a function as a gate electrode of a transistor, at least part of the third conductive layer has a function as one of a source electrode and a drain electrode of the transistor, at least part of the fourth conductive layer has a function as the other of the source electrode and the drain electrode of the transistor, the first oxide semiconductor layer has a region overlapping with the first conductive layer, the second oxide semiconductor layer has a region overlapping with the fifth conductive layer, and the second oxide semiconductor layer has a region intersecting with the second conductive layer.

For example, it is possible to provide a semiconductor device including a first conductive layer over an insulating surface, a second conductive layer over the insulating surface, a first insulating layer over the first conductive layer and the second conductive layer, a first oxide semiconductor layer over the first insulating layer, a second oxide semiconductor layer over the first insulating layer, a third conductive layer over the first oxide semiconductor layer, a fourth conductive layer over the first oxide semiconductor layer, a sixth conductive layer over the second oxide semiconductor layer, a second insulating layer over the third conductive layer, the fourth conductive layer, and the sixth conductive layer, and a fifth conductive layer over the second insulating layer. In the semiconductor device, the third conductive layer is electrically connected to the second conductive layer, the fifth conductive layer is electrically connected to the fourth conductive layer, at least part of the first conductive layer has a function as a gate electrode of a transistor, at least part of the third conductive layer has a function as one of a source electrode and a drain electrode of the transistor, at least part of the fourth conductive layer has a function as the other of the source electrode and the drain electrode of the transistor, at least part of the sixth conductive layer has a function as an auxiliary wiring, the first oxide semiconductor layer has a region overlapping with the first conductive layer, the second oxide semiconductor layer has a region overlapping with the fifth conductive layer, and the second oxide semiconductor layer has a region intersecting with the second conductive layer.

It is preferable that the first oxide semiconductor layer have a first alkali metal concentration, that the second oxide semiconductor layer have a second alkali metal concentration, and that the second alkali metal concentration be higher than the first alkali metal concentration.

It is preferable that the first oxide semiconductor layer have a first alkaline earth metal concentration, that the second oxide semiconductor layer have a second alkaline earth metal concentration, and that second alkaline earth metal concentration be higher than the first alkaline earth metal concentration.

It is preferable that the first oxide semiconductor layer have a first hydrogen concentration, that the second oxide semiconductor layer have a second hydrogen concentration, and that the second hydrogen concentration be higher than the first hydrogen concentration.

It is preferable that at least part of the fifth conductive layer have a function as one electrode of a display element, that at least part of the fifth conductive layer have a function as one electrode of a capacitor, that at least part of the second oxide semiconductor layer have a function as the other electrode of the display element, and at least part of the second oxide semiconductor layer have a function as the other electrode of the capacitor.

A region in which an active layer is not formed can be efficiently used.

DETAILED DESCRIPTION OF THE INVENTION

Figure 1:
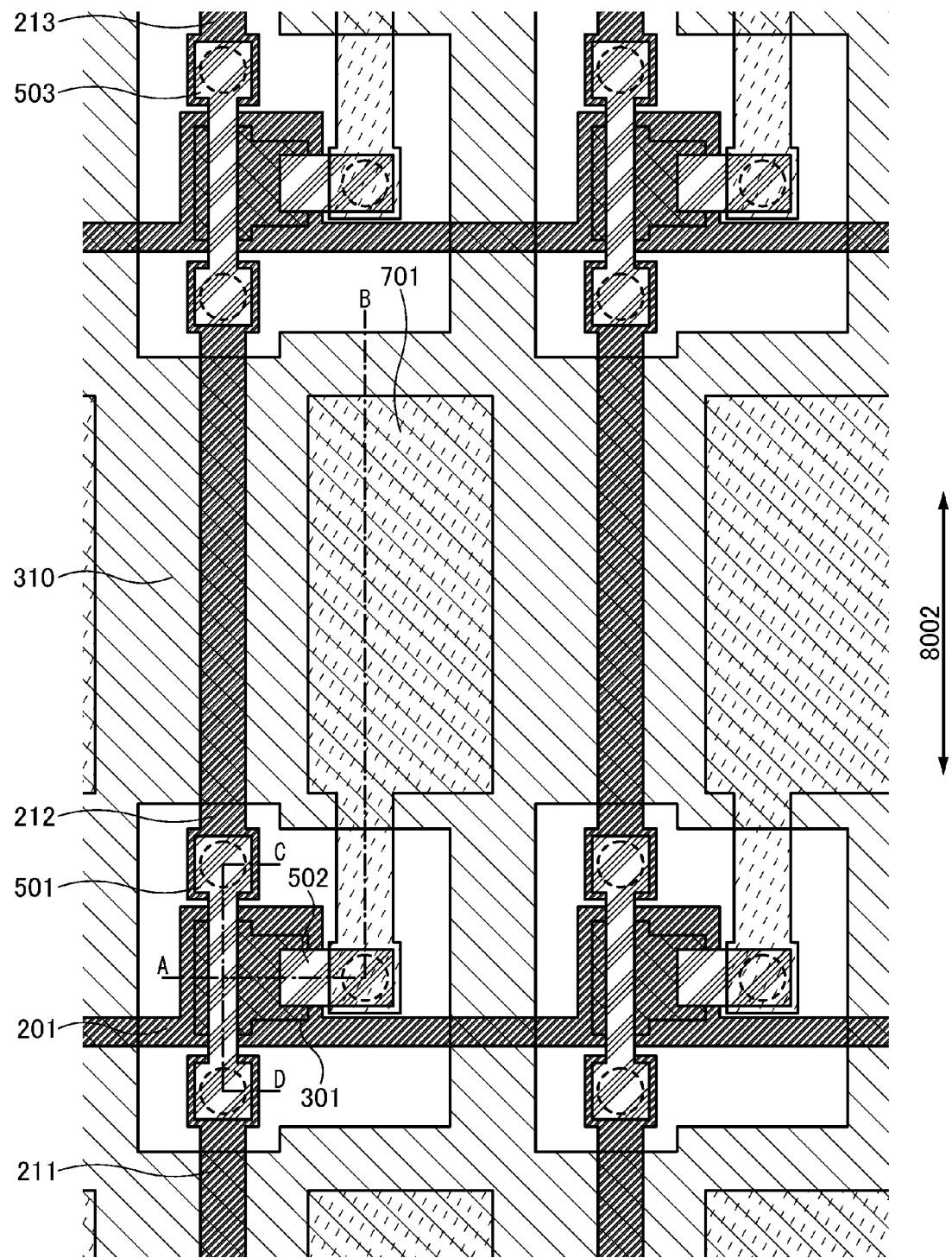
FIG. 1 illustrates an example of a semiconductor device.

Embodiments will be described in detail with reference to the drawings.

Note that it is easily understood by those skilled in the art that modes and details thereof can be modified in various ways without departing from the spirit of the present invention.

Therefore, the present invention should not be interpreted as being limited to what is described in the embodiments described below.

In the structures to be described below, the same portions, portions having similar functions, or portions having the same material are denoted by the same reference numerals or the same hatching patterns in different drawings, and explanation thereof will not be repeated.

Some or all of the following embodiments can be combined as appropriate.

(Embodiment 1)

An example of a semiconductor device is described with reference to FIGS. 1 to 3.

Figure 2:
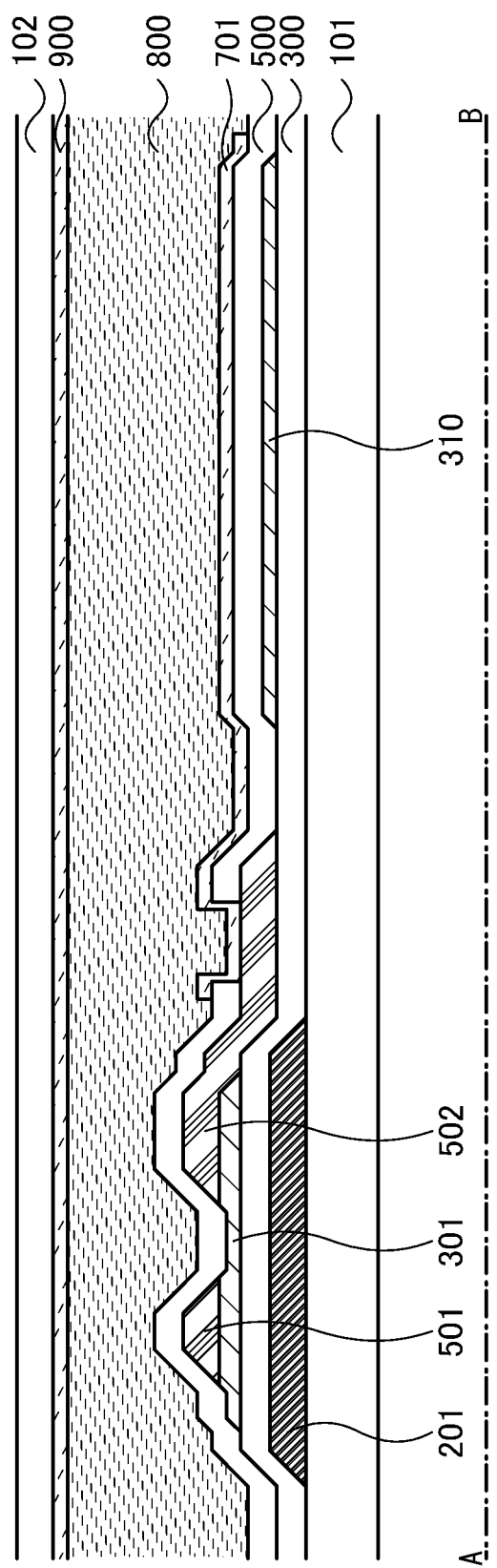
FIG. 2 illustrates an example of the semiconductor device.

FIG. 2 illustrates an example of a cross-sectional view taken along the line A-B in FIG. 1.

Figure 3:
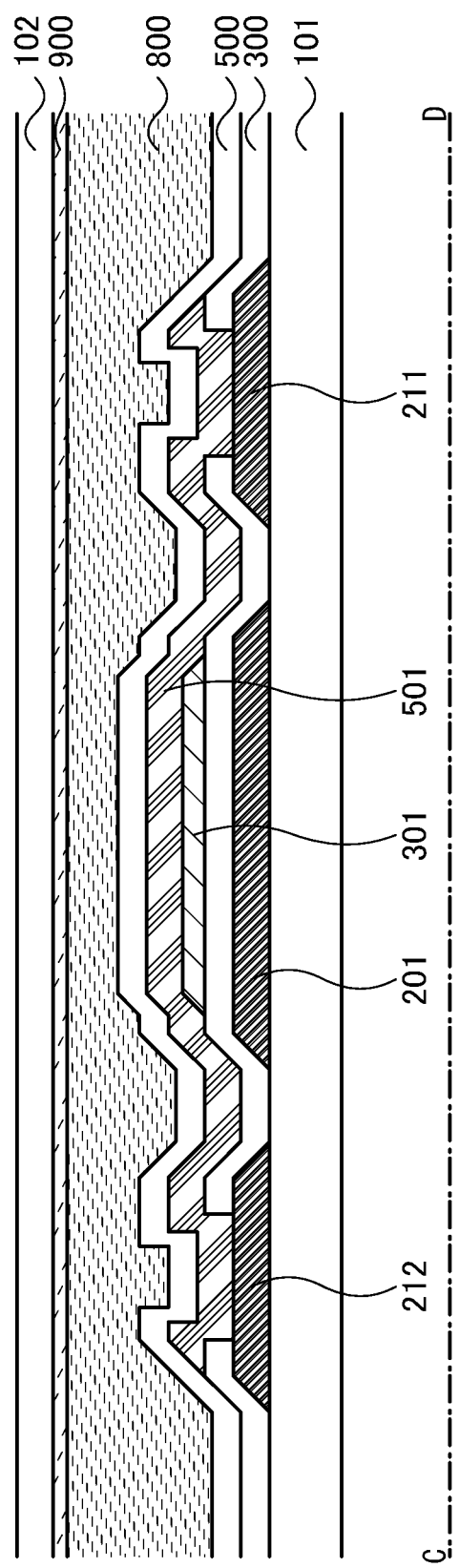
FIG. 3 illustrates an example of the semiconductor device.

FIG. 3 illustrates an example of a cross-sectional view taken along the line C-D in FIG. 1.

A first direction 8001 is a direction intersecting with a second direction 8002.

A substrate 101 has an insulating surface.

A conductive layer 201 is provided over the insulating surface.

A conductive layer 211 is provided over the insulating surface.

A conductive layer 212 is provided over the insulating surface.

A conductive layer 213 is provided over the insulating surface.

An insulating layer 300 is provided over the conductive layer 211, the conductive layer 212, and the conductive layer 213.

The insulating layer 300 has a plurality of opening portions (contact holes).

An oxide semiconductor layer 301 is provided over the insulating layer 300.

An oxide semiconductor layer 310 is provided over the insulating layer 300.

A conductive layer 501 is provided over the oxide semiconductor layer 301.

A conductive layer 502 is provided over the oxide semiconductor layer 301.

A conductive layer 503 is provided in the same step as the conductive layer 501 and the conductive layer 502.

The conductive layer 501 is electrically connected to the conductive layer 211 through one of the opening portions of the insulating layer 300.

The conductive layer 501 is electrically connected to the conductive layer 212 through one of the opening portions of the insulating layer 300.

The conductive layer 503 is electrically connected to the conductive layer 212 through one of the opening portions of the insulating layer 300.

The conductive layer 503 is electrically connected to the conductive layer 213 through one of the opening portions of the insulating layer 300.

One end of the conductive layer 501 is electrically connected to the conductive layer 211.

The other end of the conductive layer 501 is electrically connected to the conductive layer 212.

One end of the conductive layer 503 is electrically connected to the conductive layer 212.

The other end of the conductive layer 503 is electrically connected to the conductive layer 213.

An insulating layer 500 is provided over the conductive layer 501, the conductive layer 502, and the conductive layer 503.

The insulating layer 500 has a plurality of opening portions (contact holes).

A conductive layer 701 is provided over the insulating layer 500.

The conductive layer 701 is electrically connected to the conductive layer 502 through one of the opening portions of the insulating layer 500.

A liquid crystal layer 800 is provided over the conductive layer 701.

A conductive layer 900 is provided over the liquid crystal layer 800.

A substrate 102 is provided over the conductive layer 900.

The conductive layer 900 is formed on a surface of the substrate 102.

The liquid crystal layer 800 is sandwiched between the conductive layer 701 and the conductive layer 900.

An alignment film is preferably provided between the conductive layer 701 and the liquid crystal layer 800.

An alignment film is preferably provided between the conductive layer 900 and the liquid crystal layer 800.

The oxide semiconductor layer 301 has a region overlapping with the conductive layer 201.

The oxide semiconductor layer 310 has a region overlapping with the conductive layer 201.

The oxide semiconductor layer 310 has a region overlapping with the conductive layer 211.

The oxide semiconductor layer 310 has a region overlapping with the conductive layer 212.

The oxide semiconductor layer 310 has a region overlapping with the conductive layer 213.

The oxide semiconductor layer 310 has a region intersecting with the conductive layer 201.

The oxide semiconductor layer 310 has a region intersecting with the conductive layer 211.

The oxide semiconductor layer 310 has a region intersecting with the conductive layer 212.

The oxide semiconductor layer 310 has a region intersecting with the conductive layer 213.

The oxide semiconductor layer 310 has a region overlapping with the conductive layer 701.

The conductive layer 501 has a region overlapping with the conductive layer 201.

The conductive layer 501 has a region intersecting with the conductive layer 201.

The conductive layer 201 is provided so that its longitudinal direction is parallel to the first direction 8001.

The conductive layer 211 is provided so that its longitudinal direction is parallel to the second direction 8002.

The conductive layer 212 is provided so that its longitudinal direction is parallel to the second direction 8002.

The conductive layer 213 is provided so that its longitudinal direction is parallel to the second direction 8002.

The conductive layer 501 is provided so that its longitudinal direction is parallel to the second direction 8002.

The conductive layer 502 is provided so that its longitudinal direction is parallel to the first direction 8001.

The conductive layer 503 is provided so that its longitudinal direction is parallel to the second direction 8002.

The first direction 8001 is perpendicular to the second direction 8002.

FIGS. 1 to 3 illustrate an example of a liquid crystal display device which is one of semiconductor devices.

Figure 4:
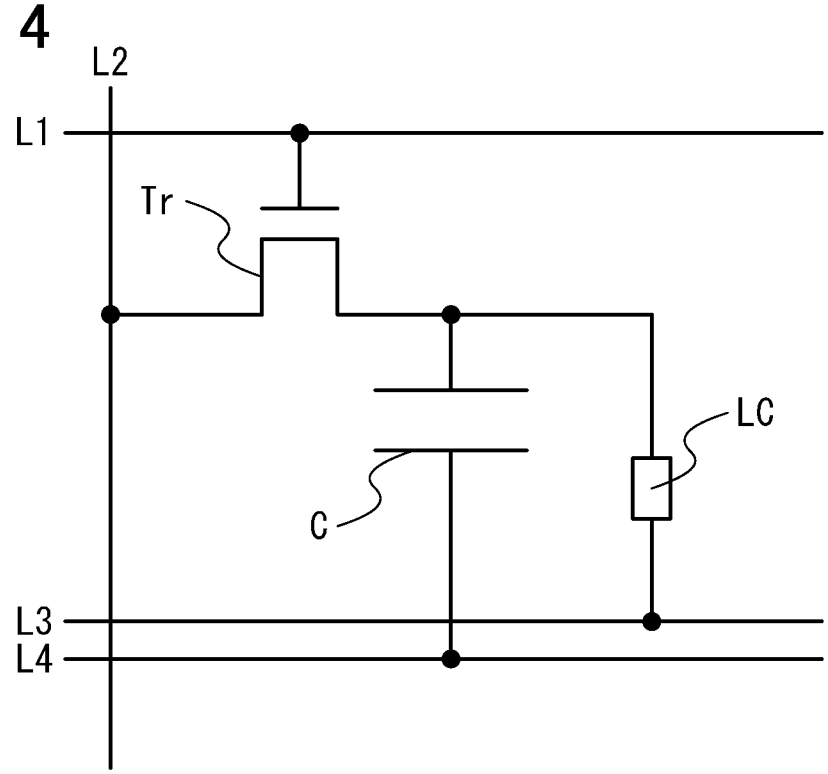
FIG. 4 illustrates an example of a semiconductor device.

FIG. 4 illustrates an example of a pixel circuit of the liquid crystal display device.

A wiring L1 is electrically connected to a gate of a transistor Tr.

A wiring L2 is electrically connected to one of a source and a drain of the transistor Tr.

The other of the source and the drain of the transistor Tr is electrically connected to one electrode of a liquid crystal element LC.

The other of the source and the drain of the transistor Tr is electrically connected to one electrode of a capacitor C.

A wiring L3 is electrically connected to the other electrode of the liquid crystal element LC.

A wiring L4 is electrically connected to the other electrode of the capacitor C.

The wiring L1, the wiring L2, the wiring L3, and the wiring L4 each have a function capable of transmitting a signal, a voltage, or a current.

The wiring L1, the wiring L2, the wiring L3, and the wiring L4 each have a function capable of being supplied with a predetermined potential.

By changing or fixing an electrical state (a signal, a voltage, a current, or a potential) of the wiring L1, on/off of the transistor Tr can be controlled.

The wiring L1 is referred to as a gate wiring, a scanning line, or the like.

By changing or fixing an electrical state (a signal, a voltage, a current, or a potential) of the wiring L2, driving of the liquid crystal element LC can be controlled.

By changing or fixing the electrical state (a signal, a voltage, a current, or a potential) of the wiring L2, charge can be stored in the capacitor C.

The wiring L2 is referred to as a source wiring, a drain wiring, a signal line, or the like.

By changing or fixing an electrical state (a signal, a voltage, a current, or a potential) of the wiring L3, driving of the liquid crystal element LC can be controlled.

The wiring L3 is referred to as a common wiring, a common electrode, or the like.

By changing or fixing an electrical state (a signal, a voltage, a current, or a potential) of the wiring L4, charge can be stored in the capacitor C.

The wiring L4 is referred to as a capacitor wiring or the like.

The wiring L3 and the wiring L4 may be electrically connected to each other.

The relation between each of FIGS. 1 to 3 and FIG. 4 is described below.

At least part of the conductive layer 201 can function as a gate electrode of a transistor Tr.

At least part of the conductive layer 201 can function as a wiring L1.

At least part of the conductive layer 211 can function as a wiring L2.

At least part of the conductive layer 212 can function as the wiring L2.

At least part of the conductive layer 213 can function as the wiring L2.

The conductive layer 201, the conductive layer 211, the conductive layer 212, and the conductive layer 213 are preferably formed in the same step.

That is, the conductive layer 201, the conductive layer 211, the conductive layer 212, and the conductive layer 213 preferably have the same material.

At least part of the insulating layer 300 can function as a gate insulating film of the transistor Tr.

At least part of the oxide semiconductor layer 301 can function as an active layer of the transistor Tr.

That is, the oxide semiconductor layer 301 has at least a channel formation region.

At least part of the oxide semiconductor layer 310 can function as the other electrode of a capacitor C.

At least part of the oxide semiconductor layer 310 can function as a wiring L4.

The oxide semiconductor layer 301 and the oxide semiconductor layer 310 are preferably formed in the same step.

That is, the oxide semiconductor layer 301 and the oxide semiconductor layer 310 preferably have the same material.

At least part of the conductive layer 501 can function as one of a source electrode and a drain electrode of the transistor Tr.

At least part of the conductive layer 501 can function as the wiring L2.

At least part of the conductive layer 502 can function as the other of the source electrode and the drain electrode of the transistor Tr.

At least part of the conductive layer 503 can function as the wiring L2.

At least part of the conductive layer 503 can function as one of a source electrode and a drain electrode of a transistor in a pixel next to a pixel including the transistor Tr.

The conductive layer 501, the conductive layer 502, and the conductive layer 503 are preferably formed in the same step.

That is, the conductive layer 501, the conductive layer 502, and the conductive layer 503 preferably have the same material.

At least part of the insulating layer 500 can function as an interlayer insulating film.

At least part of the insulating layer 500 can function as a dielectric film of the capacitor C.

At least part of the conductive layer 701 can function as one electrode of a liquid crystal element LC.

Figure 11:
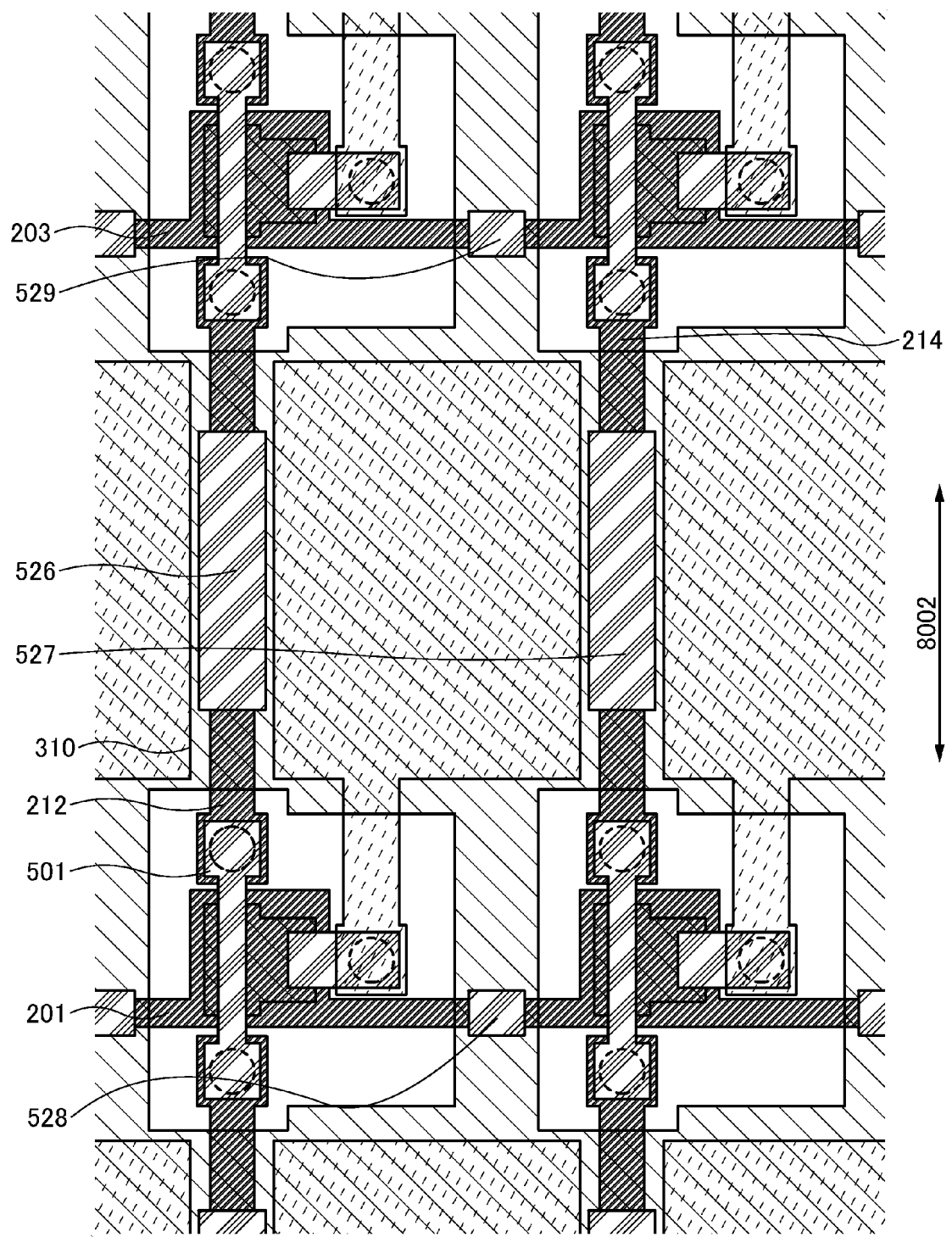
FIG. 11 illustrates an example of a semiconductor device.

At least part of the conductive layer 701 can function as one electrode of the capacitor C. The capacitance value of the capacitor C can be made large by increasing the area of the conductive layer 701. The area of the conductive layer 701 may be increased so as to overlap with the conductive layer 212, for example. Specifically, an edge portion of the conductive layer 701 may overlap with the conductive layer 212 in the first direction 8001. Further, the conductive layer 701 may overlap with the conductive layer 526 or the conductive layer 527 when providing the conductive layer 526 and the conductive layer 527 as shown in FIG. 11, which will be described later.

At least part of the liquid crystal layer 800 can function as a liquid crystal layer of the liquid crystal element LC.

At least part of the conductive layer 900 can function as the other electrode of the liquid crystal element LC.

At least part of the conductive layer 900 can function as the wiring L3.

The conductive layer 211, the conductive layer 212, the conductive layer 213, and the like are used for part of the wiring L2. Thus, part of the wiring L2 (the conductive layer 211, the conductive layer 212, the conductive layer 213, and the like) can be made to overlap with part of the wiring L4 (the oxide semiconductor layer 310).

When part of the wiring L2 (the conductive layer 211, the conductive layer 212, the conductive layer 213, and the like) overlap with part of the wiring L4 (the oxide semiconductor layer 310), the wiring L4 (the oxide semiconductor layer 310) can overlap with one electrode (the pixel electrode) of the liquid crystal element LC in each pixel.

That is, the wiring L4 can be shared by all pixels.

The wiring shared by all the pixels has a function capable of providing all the pixels with a predetermined electrical state.

It can be said that the oxide semiconductor layer 310 has a lattice shape.

It can be said that the oxide semiconductor layer 310 has a plurality of opening portions and that a transistor of each pixel is provided in each of the plurality of opening portions.

It can be said that the oxide semiconductor layer 310 has a plurality of first regions extending in the first direction 8001 and a plurality of second regions connecting the plurality of first regions.

Alternatively, it can be said that the oxide semiconductor layer 310 has a plurality of first regions extending in the second direction 8002 and a plurality of second regions connecting the plurality of first regions.

As described above, the wiring formed in the same layer as the gate electrode of the transistor is used as part of the wiring L2, whereby part of the wiring L2 can overlap with part of the wiring L4.

Since part of the wiring L2 can overlap with part of the wiring L4, part of the wiring L2 can intersect with part of the wiring L4.

By making part of the wiring L2 intersect with part of the wiring L4, the wiring L4 can be shared by all the pixels.

At least part of the structure described in this embodiment can be combined with at least part of a structure described in any of the other embodiments.

(Embodiment 2)

An example of a liquid crystal display device (one kind of semiconductor devices) which is driven by a fringe field switching (FFS) mode is described.

Figure 5:
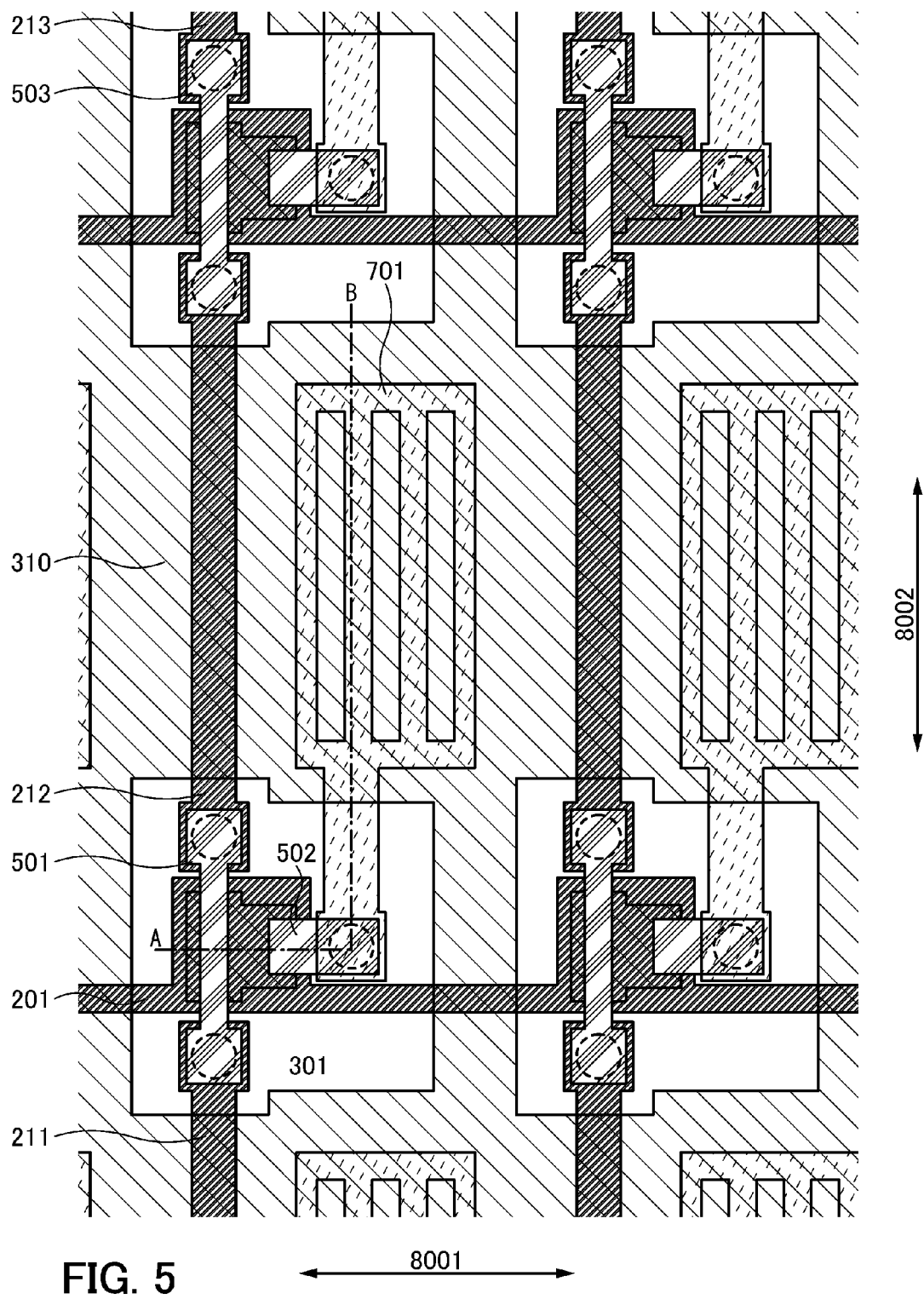
FIG. 5 illustrates an example of a semiconductor device.
Figure 6:
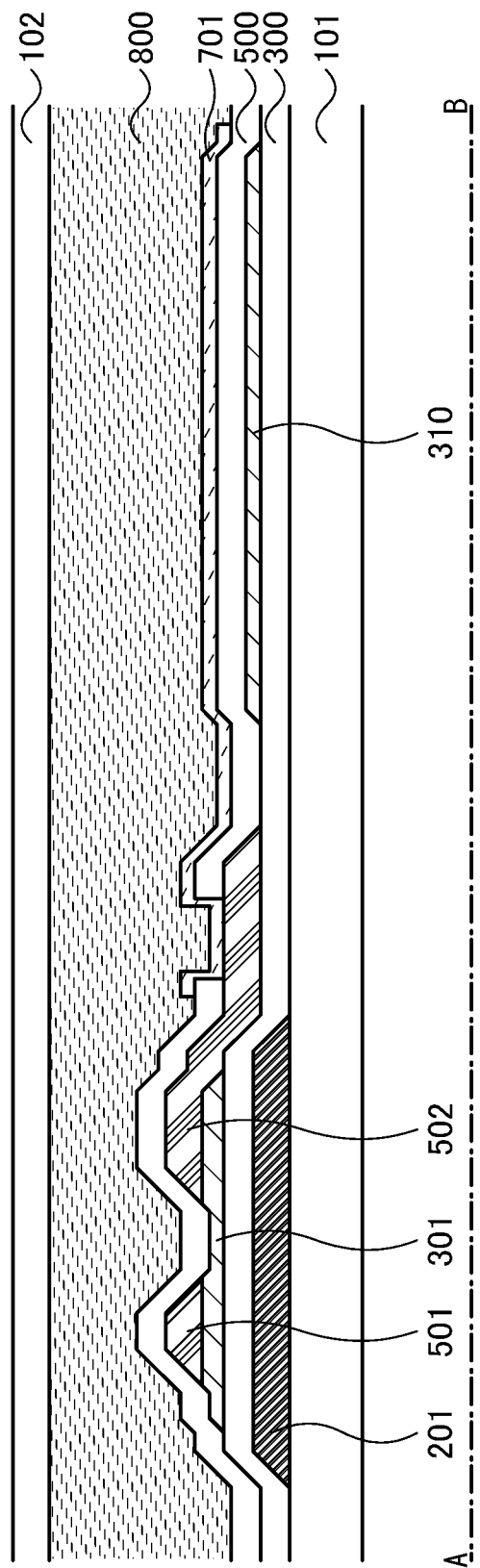
FIG. 6 illustrates an example of the semiconductor device.

FIGS. 5 and 6 illustrate an example which is different from that of FIGS. 1 to 3 in that an opening portion is provided in one electrode (the pixel electrode) of the liquid crystal element LC, e.g., in the conductive layer 701.

In FIGS. 5 and 6, at least part of the oxide semiconductor layer 310 can function as the other electrode of the liquid crystal element LC.

Since at least part of the oxide semiconductor layer 310 can function as the other electrode of the liquid crystal element LC, it is not necessary to provide the conductive layer 900.

The conductive layer 900 may be provided in FIGS. 5 and 6.

In the case where the conductive layer 900 is provided in FIGS. 5 and 6, the conductive layer 900 can be used as an element other than the other electrode of the liquid crystal element LC.

Examples of the element other than the other electrode of the liquid crystal element LC include an electric-field shielding film and an electrode of a touch panel, but the element is not limited to these examples.

The electric-field shielding film has a function capable of preventing the liquid crystal element from being affected by an external electric field.

Figure 7:
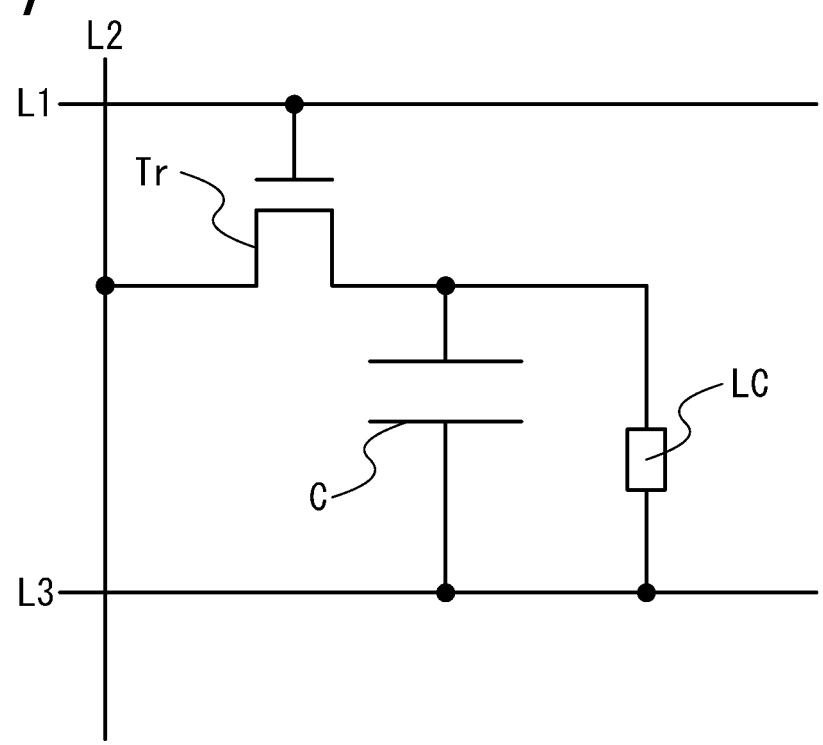
FIG. 7 illustrates an example of a semiconductor device.

FIG. 7 illustrates an example of a pixel circuit, which corresponds to FIGS. 5 and 6, of the liquid crystal display device.

The wiring L1 is electrically connected to the gate of the transistor Tr.

The wiring L2 is electrically connected to one of the source and the drain of the transistor Tr.

The other of the source and the drain of the transistor Tr is electrically connected to one electrode of the liquid crystal element LC.

The other of the source and the drain of the transistor Tr is electrically connected to one electrode of the capacitor C.

The wiring L3 is electrically connected to the other electrode of the liquid crystal element LC.

The wiring L3 is electrically connected to the other electrode of the capacitor C.

The wiring L1, the wiring L2, and the wiring L3 each have a function capable of transmitting a signal, a voltage, or a current.

The wiring L1, the wiring L2, and the wiring L3 each have a function capable of being supplied with a predetermined potential.

By changing or fixing an electrical state (a signal, a voltage, a current, or a potential) of the wiring L1, on/off of the transistor Tr can be controlled.

The wiring L1 is referred to as a gate wiring, a scanning line, or the like.

By changing or fixing an electrical state (a signal, a voltage, a current, or a potential) of the wiring L2, driving of the liquid crystal element LC can be controlled.

By changing or fixing an electrical state (a signal, a voltage, a current, or a potential) of the wiring L2, charge can be stored in the capacitor C.

The wiring L2 is referred to as a source wiring, a drain wiring, a signal line, or the like.

By changing or fixing an electrical state (a signal, a voltage, a current, or a potential) of the wiring L3, driving of the liquid crystal element LC can be controlled.

By changing or fixing an electrical state (a signal, a voltage, a current, or a potential) of the wiring L3, charge can be stored in the capacitor C.

The wiring L3 is referred to as a common wiring, a common electrode, or the like.

It can be said that the wiring L3 is a wiring having a first function as a capacitor wiring or the like and a second function as a common wiring, a common electrode, or the like.

With the above-described structure, a liquid crystal display device which is driven by an FFS mode can be provided.

At least part of the structure described in this embodiment can be combined with at least part of a structure described in any of the other embodiments.

(Embodiment 3)

The resistance value of the oxide semiconductor layer 310 may be high in some cases.

Hence, a conductive layer which can function as an auxiliary wiring is preferably provided.

Figure 8:
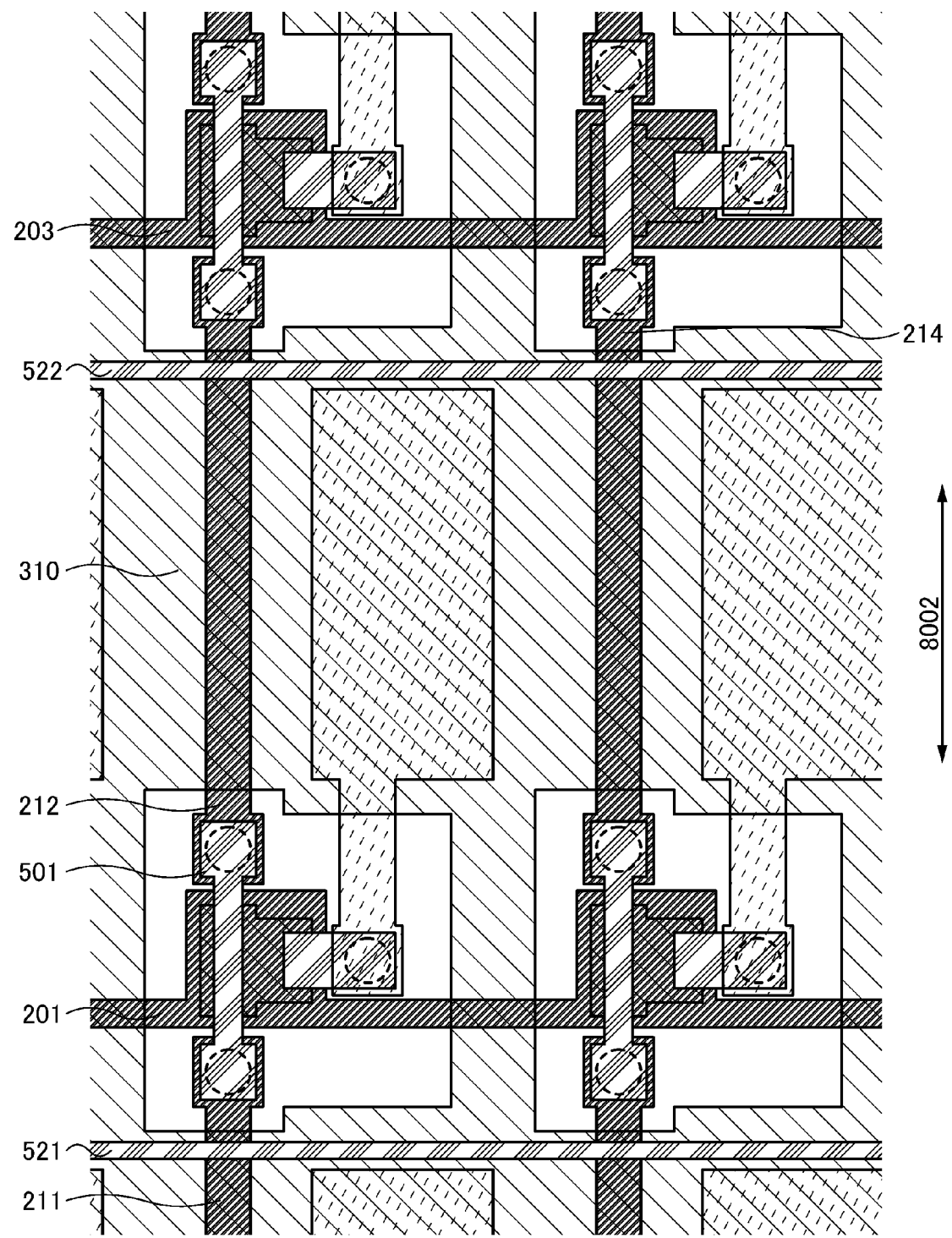
FIG. 8 illustrates an example of a semiconductor device.

For example, FIG. 8 illustrates an example of a drawing which is different from FIGS. 1 to 4 in that a conductive layer 521, a conductive layer 522, and the like are provided.

Figure 9:
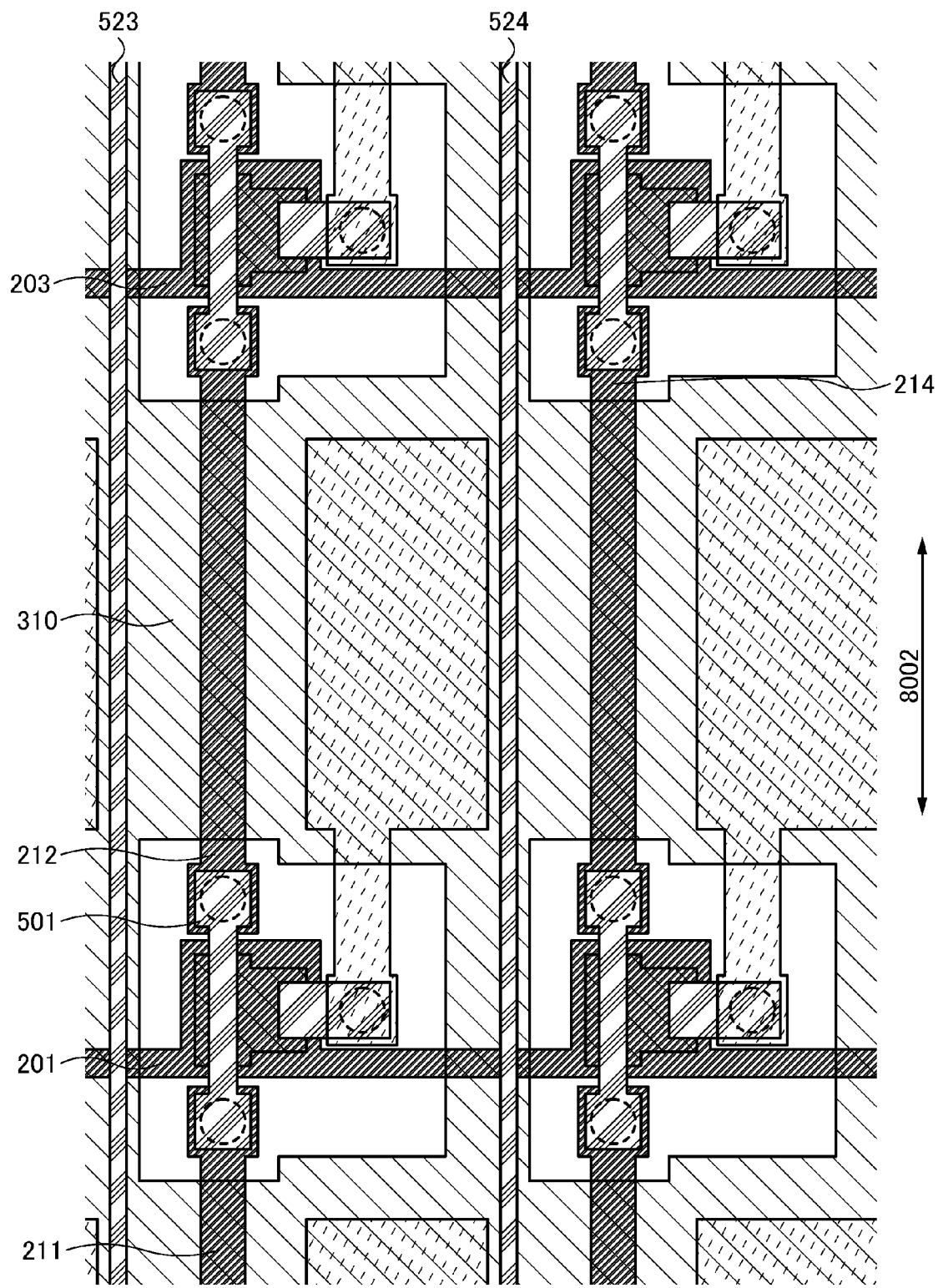
FIG. 9 illustrates an example of a semiconductor device.

For example, FIG. 9 illustrates an example of a drawing which is different from FIGS. 1 to 4 in that a conductive layer 523, a conductive layer 524, and the like are provided.

Figure 10:
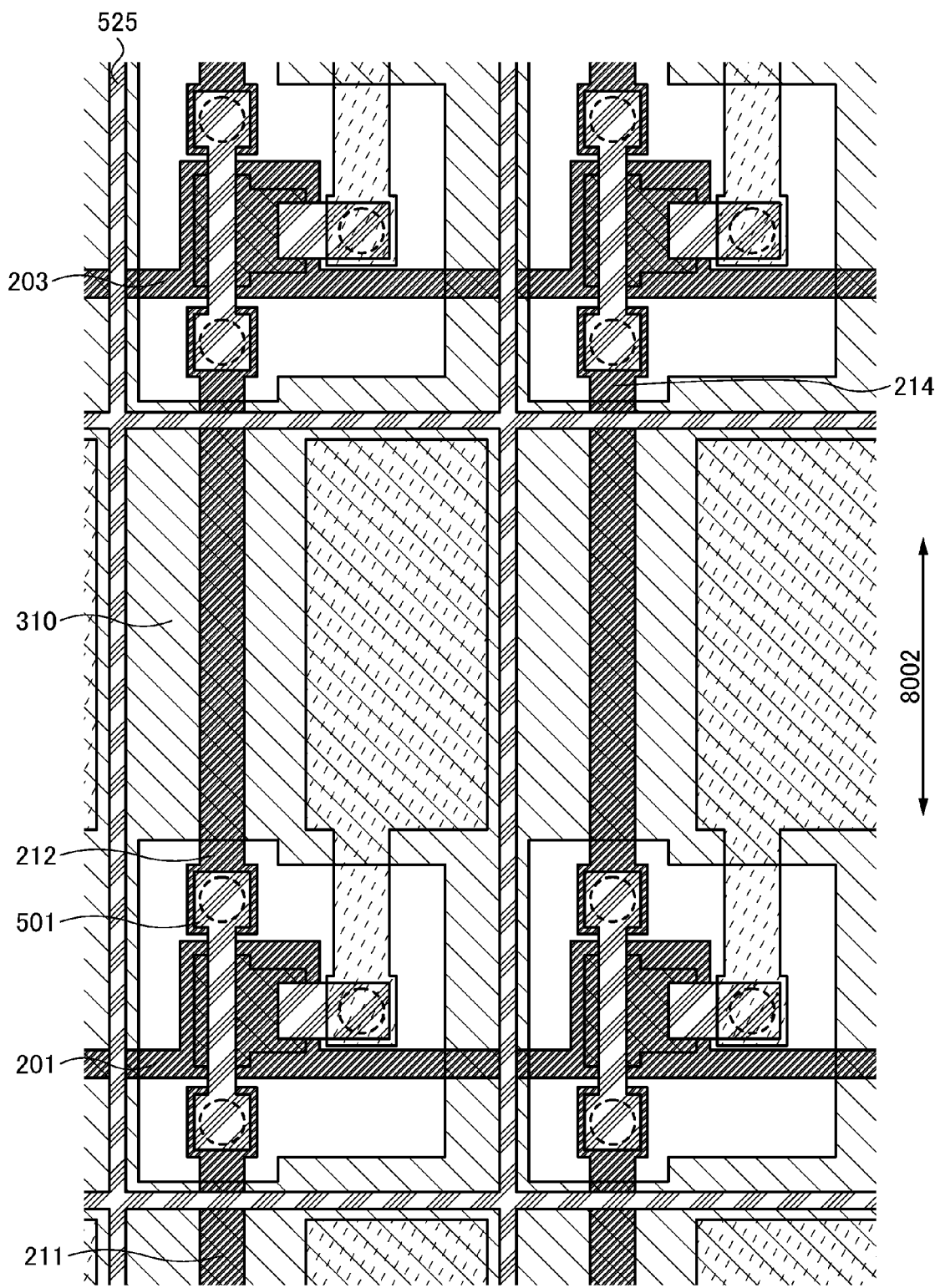
FIG. 10 illustrates an example of a semiconductor device.

For example, FIG. 10 illustrates an example of a drawing which is different from FIGS. 1 to 4 in that a conductive layer 525 and the like are provided.

For example, FIG. 11 illustrates an example of a drawing which is different from FIGS. 1 to 4 in that a conductive layer 526, a conductive layer 527, a conductive layer 528, a conductive layer 529, and the like are provided.

In each of FIGS. 8 to 11, the conductive layer 203 is a conductive layer which is formed in the same step as the conductive layer 201.

That is, the conductive layer 203 has the same material as the conductive layer 201.

In each of FIGS. 8 to 11, the conductive layer 214 is a conductive layer which is formed in the same step as the conductive layer 201.

That is, the conductive layer 214 has the same material as the conductive layer 201.

The conductive layers (the conductive layers 521 to 529 and the like) which can function as auxiliary wirings in FIGS. 1 to 4 are shown. Further, the conductive layers (the conductive layers 521 to 529 and the like) which can function as auxiliary wirings may be provided in FIGS. 5 to 7.

The conductive layers (the conductive layers 521 to 529 and the like) which can function as auxiliary wirings can be formed in the same step as the conductive layer 501.

That is, the conductive layers (the conductive layers 521 to 529 and the like) which can function as auxiliary wirings can be formed using the same material as the conductive layer 501.

Each of the conductive layers (the conductive layers 521 to 529 and the like) which can function as auxiliary wirings has a region being in contact with the oxide semiconductor layer 310.

In FIG. 8, for example, each of the conductive layer 521 and the conductive layer 522 is continuously provided in the first direction 8001.

In FIG. 9, for example, each of the conductive layer 523 and the conductive layer 524 is continuously provided in the second direction 8002.

In FIG. 10, for example, the conductive layer 525 is continuously provided in the first direction 8001, and the conductive layer 525 is continuously provided in the second direction 8002.

It can be said that the conductive layer 525 has a lattice shape in FIG. 10.

It can be said that the conductive layer 525 has a plurality of opening portions in FIG. 10.

It can be said that a pixel (the transistor, the pixel electrode, and the like) is provided in each of the plurality of opening portions of the conductive layer 525 in FIG. 10.

In FIG. 11, for example, the conductive layer 528, the conductive layer 529, and the like are intermittently provided in the first direction 8001.

In FIG. 11, for example, the conductive layer 526, the conductive layer 527, and the like are intermittently provided in the second direction 8002.

In the case of the circuit shown in FIG. 4, for example, at least part of the conductive layers (the conductive layers 521 to 529 and the like) capable of functioning as auxiliary wirings can function as the wiring L4.

In the case of the circuit shown in FIG. 7, for example, at least part of the conductive layers (the conductive layers 521 to 529 and the like) capable of functioning as auxiliary wirings can function as the wiring L3.

That is, the conductive layers (the conductive layers 521 to 529 and the like) capable of functioning as auxiliary wirings can reduce the resistance value of the wiring L3 or the wiring L4.

The conductive layer 521 has a region overlapping with the conductive layer 211.

The conductive layer 521 has a region intersecting with the conductive layer 211.

The conductive layer 522 has a region overlapping with the conductive layer 212.

The conductive layer 522 has a region intersecting with the conductive layer 212.

The conductive layer 522 has a region overlapping with the conductive layer 214.

The conductive layer 522 has a region intersecting with the conductive layer 214.

The conductive layer 523 has a region overlapping with the conductive layer 201.

The conductive layer 523 has a region intersecting with the conductive layer 201.

The conductive layer 523 has a region overlapping with the conductive layer 203.

The conductive layer 523 has a region intersecting with the conductive layer 203.

The conductive layer 524 has a region overlapping with the conductive layer 201.

The conductive layer 524 has a region intersecting with the conductive layer 201.

The conductive layer 524 has a region overlapping with the conductive layer 203.

The conductive layer 524 has a region intersecting with the conductive layer 203.

The conductive layer 525 has a region overlapping with the conductive layer 201.

The conductive layer 525 has a region intersecting with the conductive layer 201.

The conductive layer 525 has a region overlapping with the conductive layer 203.

The conductive layer 525 has a region intersecting with the conductive layer 203.

The conductive layer 525 has a region overlapping with the conductive layer 211.

The conductive layer 525 has a region intersecting with the conductive layer 211.

The conductive layer 525 has a region overlapping with the conductive layer 212.

The conductive layer 525 has a region intersecting with the conductive layer 212.

The conductive layer 525 has a region overlapping with the conductive layer 214.

The conductive layer 525 has a region intersecting with the conductive layer 214.

The conductive layer 526 has a region overlapping with the conductive layer 212.

The conductive layer 526 has a region intersecting with the conductive layer 212.

The conductive layer 527 has a region overlapping with the conductive layer 214.

The conductive layer 527 has a region intersecting with the conductive layer 214.

The conductive layer 528 has a region overlapping with the conductive layer 201.

The conductive layer 528 has a region intersecting with the conductive layer 201.

The conductive layer 529 has a region overlapping with the conductive layer 203.

The conductive layer 529 has a region intersecting with the conductive layer 203.

As described above, the conductive layer capable of functioning as an auxiliary wiring intersects with the conductive layer formed in the same step as the gate electrode of the transistor. Thus, the conductive layer capable of functioning as an auxiliary wiring can be provided to extend over a plurality of pixels.

It is preferable to provide intermittently the conductive layers capable of functioning as auxiliary wirings as illustrated in FIG. 11, in terms of increasing the aperture ratio of a pixel.

For example, the conductive layer 526 has a first region overlapping with the conductive layer 212, a second region which does not overlap with the conductive layer 212, and a third region which does not overlap with the conductive layer 212.

For example, the conductive layer 527 has a first region overlapping with the conductive layer 214, a second region which does not overlap with the conductive layer 214, and a third region which does not overlap with the conductive layer 214.

For example, the conductive layer 528 has a first region overlapping with the conductive layer 201, a second region which does not overlap with the conductive layer 201, and a third region which does not overlap with the conductive layer 201.

For example, the conductive layer 529 has a first region overlapping with the conductive layer 203, a second region which does not overlap with the conductive layer 203, and a third region which does not overlap with the conductive layer 203.

One of the second region and the third region is located in one of two adjacent pixels. The other of the second region and the third region is located in the other of the two adjacent pixels.

The first region is located between the second region and the third region.

It is preferable that the area of the second region and the area of the third region be small in terms of increasing the aperture ratio of the pixel.

For example, the area of the second region is preferably smaller than the area of the first region, in which case the aperture ratio of the pixel can be increased.

For example, the area of the third region is preferably smaller than the area of the first region, in which case the aperture ratio of the pixel can be increased.

For example, the sum of the area of the second region and the area of the third region is preferably smaller than the area of the first region, in which case the aperture ratio of the pixel can be significantly increased.

For example, one of the area of the second region and the area of the third region may be zero.

For example, each of the area of the second region and the area of the third region may be zero.

In the case where each of the area of the second region and the area of the third region is zero, the whole of the conductive layer capable of functioning as an auxiliary wiring overlaps with the conductive layer thereunder.

It is preferable that the whole of the conductive layer capable of functioning as an auxiliary wiring overlap with the conductive layer thereunder, in which case the aperture ratio of the pixel can be the highest.

For example, the whole of the conductive layer 526 may overlap with the conductive layer 212.

For example, the whole of the conductive layer 527 may overlap with the conductive layer 214.

For example, the whole of the conductive layer 528 may overlap with the conductive layer 201.

For example, the whole of the conductive layer 529 may overlap with the conductive layer 203.

At least part of the structure described in this embodiment can be combined with at least part of a structure described in any of the other embodiments.

(Embodiment 4)

An example in which the oxide semiconductor layer 310 is provided to extend over all the pixels is shown in any of the other embodiments.

Figure 12:
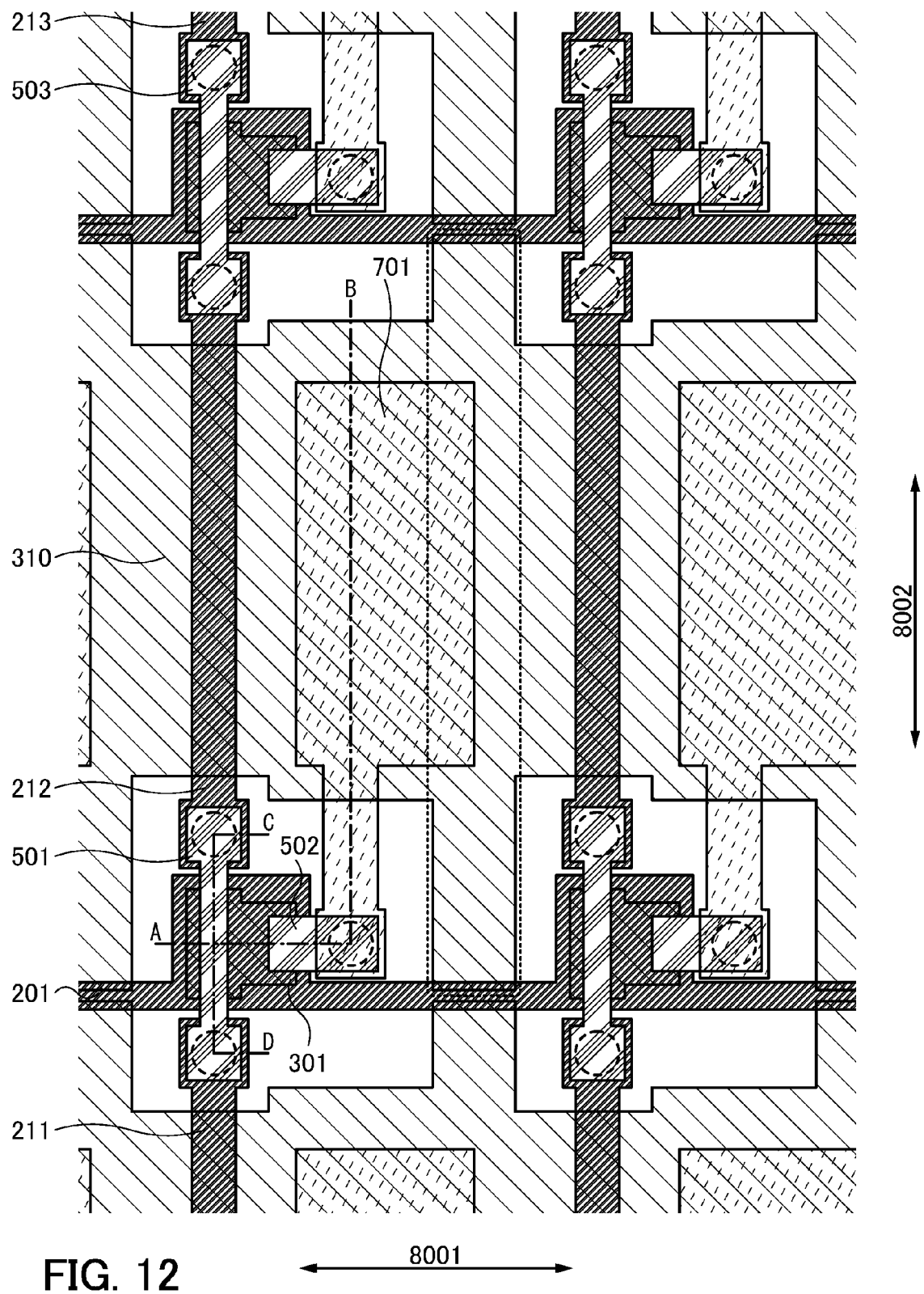
FIG. 12 illustrates an example of a semiconductor device.

As shown in FIG. 12, for example, the oxide semiconductor layer 310 may be provided to extend over a plurality of pixels arranged in the first direction 8001.

Figure 13:
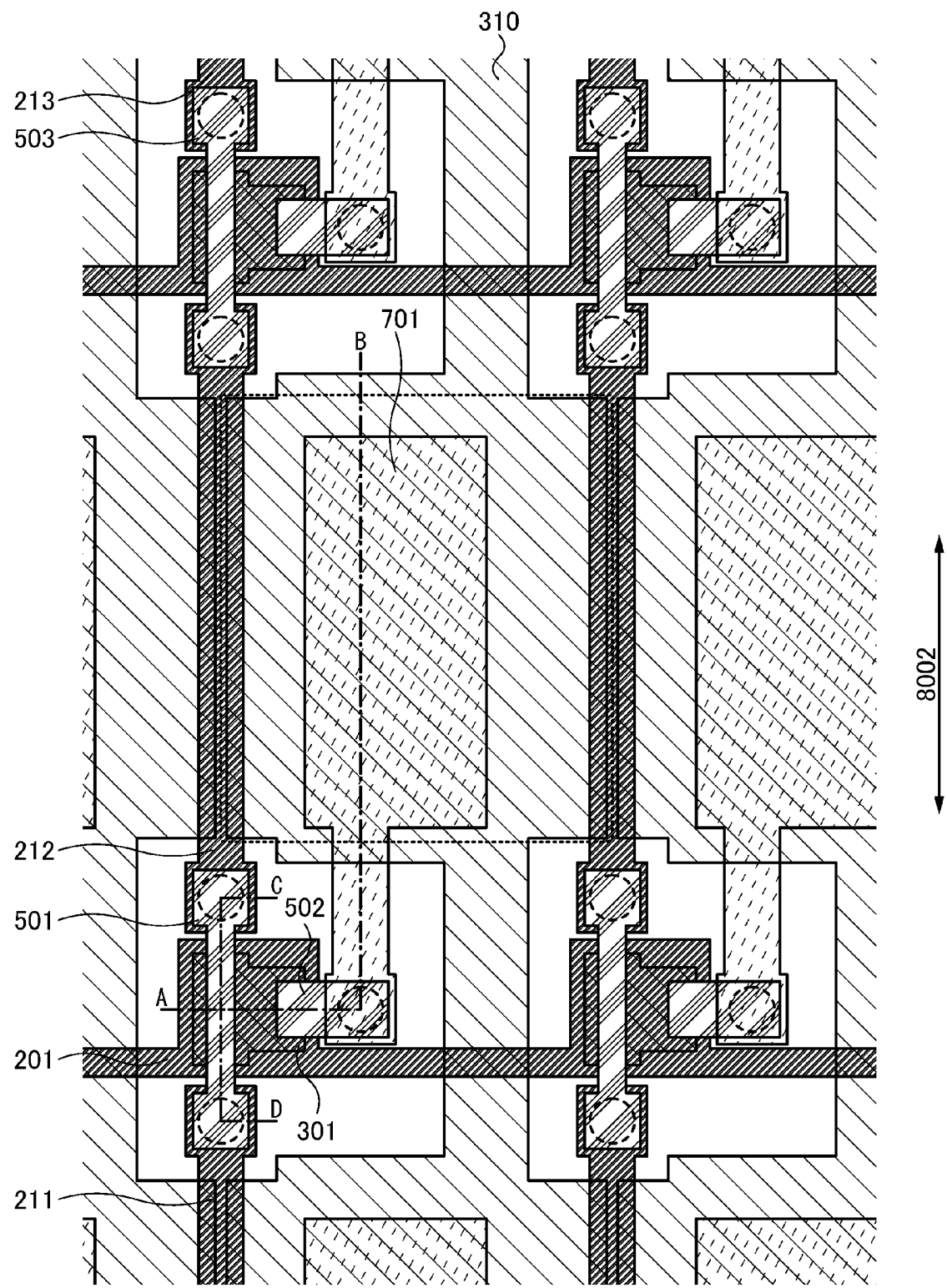
FIG. 13 illustrates an example of a semiconductor device.

As shown in FIG. 13, for example, the oxide semiconductor layer 310 may be provided to extend over a plurality of pixels arranged in the second direction 8002.

The plurality of pixels arranged in the first direction 8001 is referred to as a "row".

The plurality of pixels arranged in the second direction 8002 is referred to as a "column".

The oxide semiconductor layer is provided for every row in FIG. 12.

The oxide semiconductor layer is provided for every column in FIG. 13.

In FIG. 12, the conductive layers (the conductive layer 201 and the like) corresponding to the wiring L1 preferably overlaps with the oxide semiconductor layer (the oxide semiconductor layer 310 or the like) corresponding to the wiring L3 or the wiring L4.

In FIG. 12, in a partial region of the oxide semiconductor layer (the oxide semiconductor layer 310 or the like) corresponding to the wiring L3 or the wiring L4, the length in the second direction 8002 can be increased. Thus, the resistance value of the wiring L3 or the wiring L4 can be reduced.

The partial region of the oxide semiconductor layer (the oxide semiconductor layer 310 or the like) corresponding to the wiring L3 or the wiring L4 is, for example, a region surrounded by a dotted line in FIG. 12.

In FIG. 12, the oxide semiconductor layer corresponding to the wiring L3 or the wiring L4 overlaps with two adjacent wirings L1. However, the oxide semiconductor layer corresponding to the wiring L3 or the wiring L4 may overlap with only one of the two adjacent wirings L1.

Even when the oxide semiconductor layer corresponding to the wiring L3 or the wiring L4 overlaps with only one of the two adjacent wirings L1, the resistance value of the wiring L3 or the wiring L4 can be reduced.

In FIG. 13, the conductive layers (the conductive layers 212 and the like) corresponding to the wiring L2 preferably overlap with the oxide semiconductor layer (the oxide semiconductor layer 310 or the like) corresponding to the wiring L3 or the wiring L4.

In FIG. 13, in a partial region of the oxide semiconductor layer (the oxide semiconductor layer 310 or the like) corresponding to the wiring L3 or the wiring L4, the length in the first direction 8001 can be long. Thus, the resistance value of the wiring L3 or the wiring L4 can be reduced.

The partial region of the oxide semiconductor layer (the oxide semiconductor layer 310 or the like) corresponding to the wiring L3 or the wiring L4 is, for example, a region surrounded by a dotted line in FIG. 13.

In FIG. 13, the oxide semiconductor layer corresponding to the wiring L3 or the wiring L4 overlaps with two adjacent wirings L2. However, the oxide semiconductor layer corresponding to the wiring L3 or the wiring L4 may overlap with only one of the two adjacent wirings L2.

Even when the oxide semiconductor layer corresponding to the wiring L3 or the wiring L4 overlaps with only one of the two adjacent wirings L2, the resistance value of the wiring L3 or the wiring L4 can be reduced.

In each of FIGS. 12 and 13, the conductive layers (the conductive layers 521 to 529 and the like) capable of functioning as auxiliary wirings may be provided.

At least part of the structure described in this embodiment can be combined with at least part of a structure described in any of the other embodiments.

(Embodiment 5)

In order to reduce the resistance value of the oxide semiconductor layer (the oxide semiconductor layer 310 or the like) corresponding to the wiring L3 or the wiring L4, it is preferable to contain alkali metal, alkaline earth metal, hydrogen, or the like in the oxide semiconductor layer corresponding to the wiring L3 or the wiring L4.

For example, it is preferable that a substance containing alkali metal, a substance containing alkaline earth metal, a substance containing hydrogen, or the like be selectively added to the oxide semiconductor layer corresponding to the wiring L3 or the wiring L4.

When alkali metal, alkaline earth metal, hydrogen, or the like is contained in the oxide semiconductor layer which is to be the active layer of the transistor Tr, the electrical characteristics of the transistor Tr are adversely affected.

Thus, the substance containing alkali metal, the substance containing alkaline earth metal, the substance containing hydrogen, or the like is preferably contained as little as possible in the oxide semiconductor layer which is to be the active layer of the transistor Tr.

It is preferable that alkali metal, alkaline earth metal, hydrogen, or the like be thoroughly eliminated from the oxide semiconductor layer which is to be the active layer of the transistor Tr.

For example, the substance containing alkali metal, the substance containing alkaline earth metal, the substance containing hydrogen, or the like can be added by an ion doping method, an ion implantation method, or the like in a state where the oxide semiconductor layer which is to be the active layer of the transistor Tr is covered with a mask.

In the case where the substance containing alkali metal is added, the alkali metal concentration in the oxide semiconductor layer corresponding to the wiring L3 or the wiring L4 is higher than the alkali metal concentration in the oxide semiconductor layer which is to be the active layer of the transistor Tr.

In the case where the substance containing alkaline earth metal is added, the alkaline earth metal concentration in the oxide semiconductor layer corresponding to the wiring L3 or the wiring L4 is higher than the alkaline earth metal concentration in the oxide semiconductor layer which is to be the active layer of the transistor Tr.

In the case where the substance containing hydrogen is added, the hydrogen concentration in the oxide semiconductor layer corresponding to the wiring L3 or the wiring L4 is higher than the hydrogen concentration in the oxide semiconductor layer which is to be the active layer of the transistor Tr.

Two or more kinds of substances containing alkali metal may be added.

Two or more kinds of substances containing alkaline earth metal may be added.

Two or more kinds of substances containing hydrogen may be added.

One or more kinds of substances containing alkali metal and one or more kinds of substances containing alkaline earth metal may be added.

One or more kinds of substances containing alkali metal and one or more kinds of substances containing hydrogen may be added.

One or more kinds of substances containing alkaline earth metal and one or more kinds of substances containing hydrogen may be added.

One or more kinds of substances containing alkali metal, one or more kinds of substances containing alkaline earth metal, and one or more kinds of substances containing hydrogen may be added.

Examples of the substance containing alkali metal include alkali metal and an alkali metal compound.

Examples of the alkali metal include lithium (Li), sodium (Na), potassium (K), rubidium (Rb), cesium (Cs), and francium (Fr).

Examples of the alkali metal compound include oxide of alkali metal, nitride of alkali metal, fluoride of alkali metal, and chloride of alkali metal.

Examples of the substance containing alkaline earth metal include alkaline earth metal and an alkaline earth metal compound.

Examples of the alkaline earth metal include beryllium (Be), magnesium (Mg), calcium (Ca), strontium (Sr), barium (Ba), and radium (Ra).

Examples of the alkaline earth metal compound include oxide of alkaline earth metal, nitride of alkaline earth metal, fluoride of alkaline earth metal, and chloride of alkaline earth metal.

Examples of the substance containing hydrogen include hydrogen (H), water ($H_2O$), silane ($SiH_4$), phosphine ($PH_3$), and diborane ($B_2H_6$).

The alkali metal concentration, the alkaline earth metal concentration, the hydrogen concentration, or the like can be measured by secondary ion mass spectrometry (SIMS), Rutherford backscattering spectroscopy (RBS), or the like. However, a method for measuring each concentration is not limited to these examples.

At least part of the structure described in this embodiment can be combined with at least part of a structure described in any of the other embodiments.

(Embodiment 6)

FIGS. 14 to 18 illustrate examples of a structure for containing alkali metal, alkaline earth metal, hydrogen, or the like in the oxide semiconductor layer 310.

Figure 14:
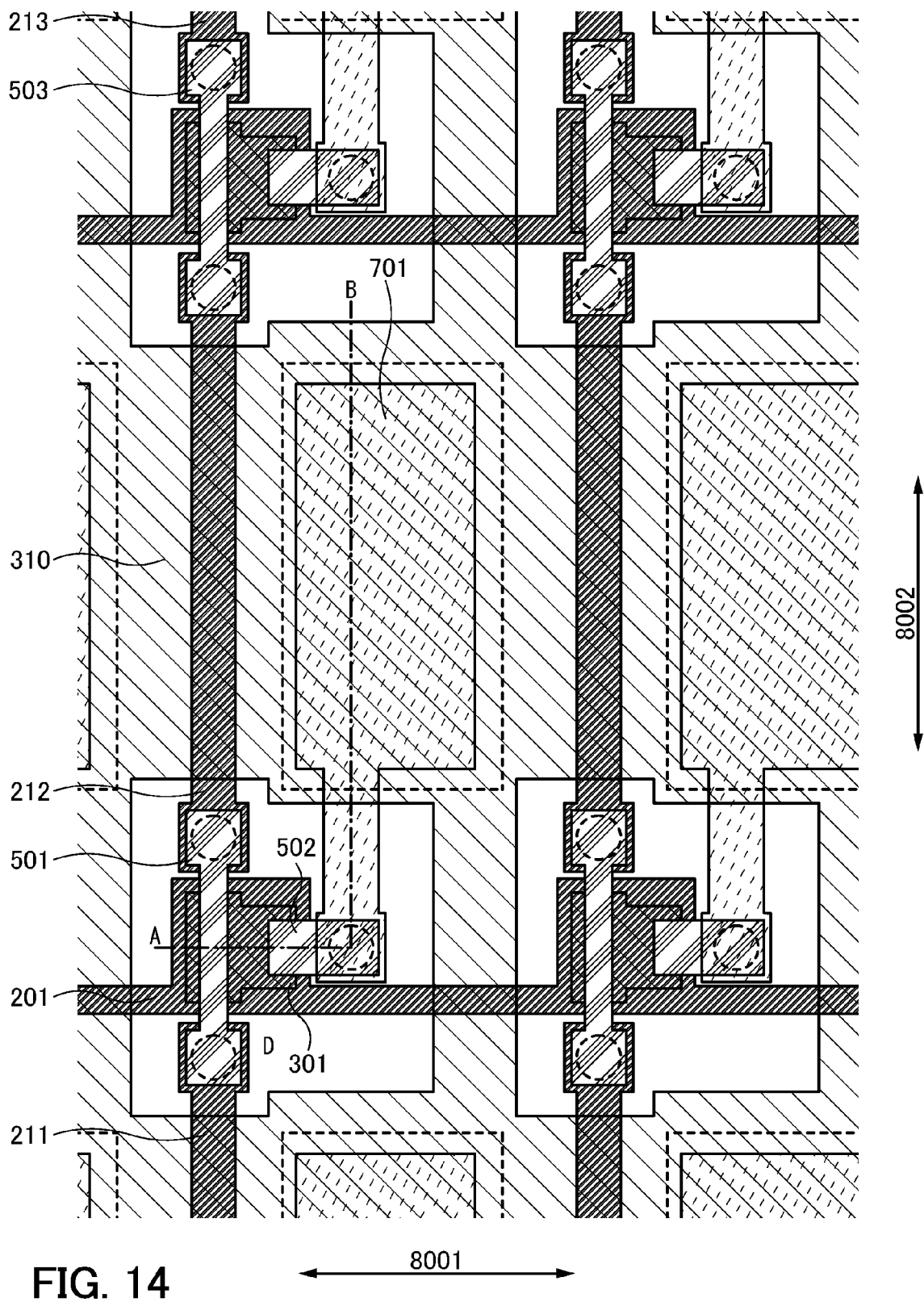
FIG. 14 illustrates an example of a semiconductor device.

FIG. 14 illustrates an example of a drawing which is different from FIG. 1 in that an opening portion is provided in the insulating layer 300 or the insulating layer 500.

A region surrounded by a dashed line in FIG. 14 corresponds to the opening portion.

In FIG. 14, the oxide semiconductor layer 310 has a region overlapping with the opening portion.

In FIG. 14, the conductive layer 701 has a region overlapping with the opening portion.

Figure 15:
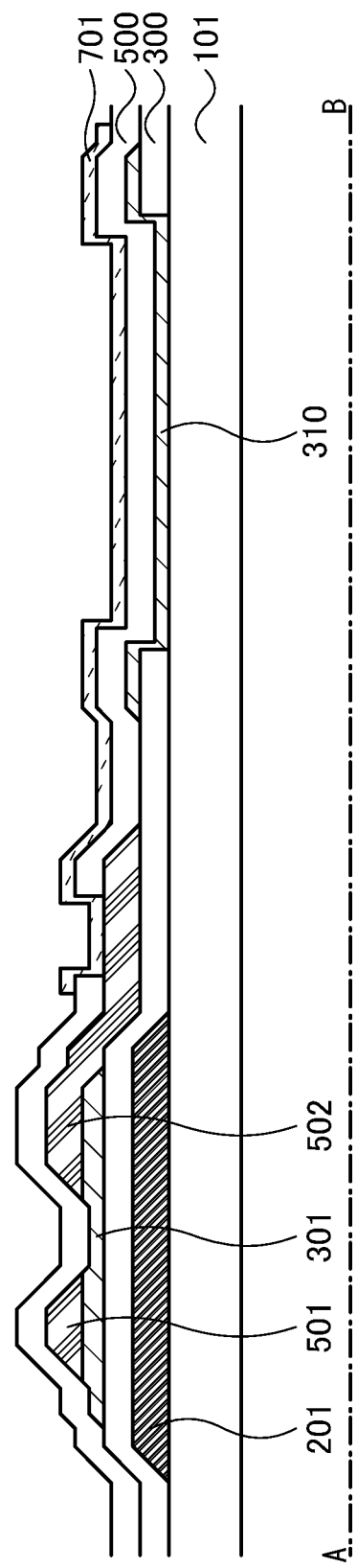
FIG. 15 illustrates an example of the semiconductor device.

FIG. 15 illustrates an example of a cross-sectional view taken along the line A-B in FIG. 14.

FIG. 15 illustrates an example in which the opening portion is provided in the insulating layer 300.

Figure 16:
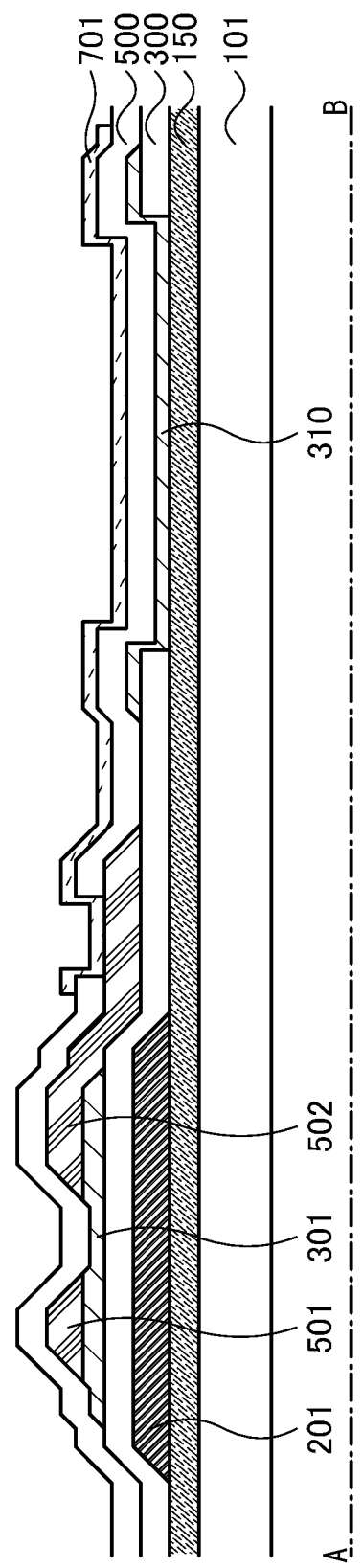
FIG. 16 illustrates an example of the semiconductor device.

FIG. 16 illustrates an example of a cross-sectional view taken along the line A-B in FIG. 14.

FIG. 16 illustrates an example in which the opening portion is provided in the insulating layer 300.

In FIG. 16, an insulating layer 150 is provided between the substrate 101 and the conductive layer 201.

In FIG. 16, at least part of the insulating layer 150 can function as a base film.

Figure 17:
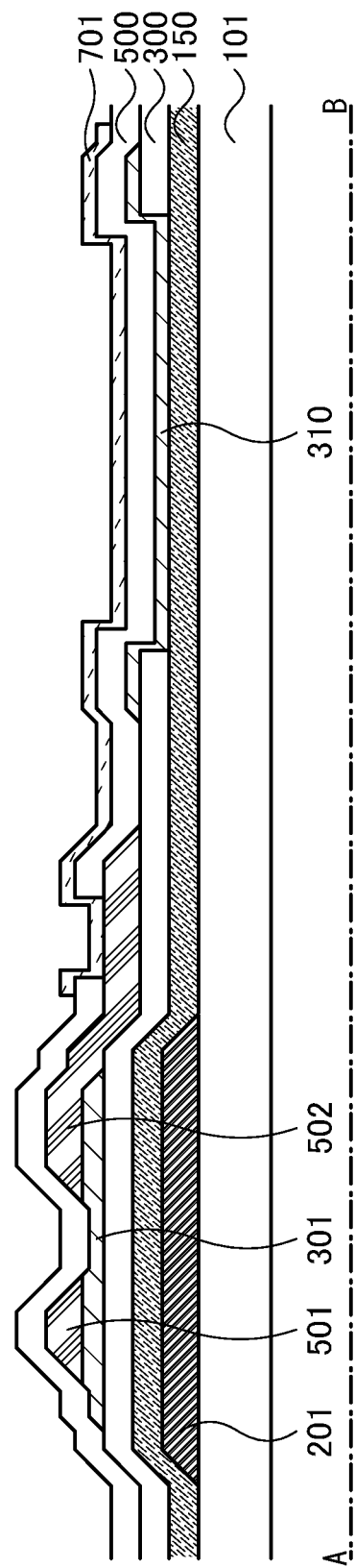
FIG. 17 illustrates an example of the semiconductor device.

FIG. 17 illustrates an example of a cross-sectional view taken along the line A-B in FIG. 14.

FIG. 17 illustrates an example in which the opening portion is provided in the insulating layer 300.

In FIG. 17, the insulating layer 150 is provided between the conductive layer 201 and the insulating layer 300.

In FIG. 17, at least part of the insulating layer 150 can function as a gate insulating film of the transistor.

Figure 18:
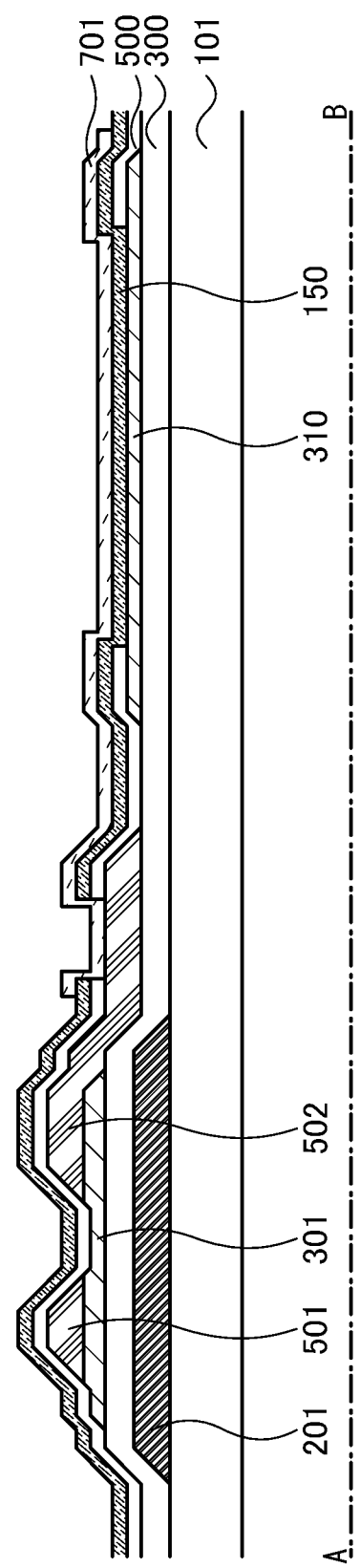
FIG. 18 illustrates an example of the semiconductor device.

FIG. 18 illustrates an example of a cross-sectional view taken along the line A-B in FIG. 14.

FIG. 18 illustrates an example in which the opening portion is provided in the insulating layer 500.

In FIG. 18, the insulating layer 150 is provided between the insulating layer 500 and the conductive layer 701.

In FIG. 18, at least part of the insulating layer 150 can function as an interlayer insulating film.

In FIG. 15, the substrate 101 is a glass substrate containing sodium (Na), for example.

It is known that an inexpensive glass substrate contains a large amount of sodium (Na).

In FIG. 15, the oxide semiconductor layer 310 has a region being in contact with the substrate 101.

The contact of the oxide semiconductor layer 310 with the substrate 101 allows the diffusion of sodium (Na) from the substrate 101 into the oxide semiconductor layer 310.

The diffusion of sodium (Na) from the substrate 101 into the oxide semiconductor layer 310 causes generation of carriers in the oxide semiconductor layer 310. Thus, the resistance of the oxide semiconductor layer 310 can be reduced.

The concentration of sodium (Na) in the vicinity of the interface between the oxide semiconductor layer 310 and the substrate 101 (the lower portion of the oxide semiconductor layer 310) is particularly high.

That is, the sodium concentration in a predetermined region of the oxide semiconductor layer 310 is higher than the sodium concentration in a predetermined region of the oxide semiconductor layer 301.

In FIGS. 16 to 18, the insulating layer 150 includes the substance containing alkali metal, the substance containing alkaline earth metal, or the substance containing hydrogen.

The insulating layer 150 may include two or more kinds of substances containing alkali metal.

The insulating layer 150 may include two or more kinds of substances containing alkaline earth metal.

The insulating layer 150 may include two or more kinds of substances containing hydrogen.

The insulating layer 150 may include one or more kinds of substances containing alkali metal and one or more kinds of substances containing alkaline earth metal.

The insulating layer 150 may include one or more kinds of substances containing alkali metal and one or more kinds of substances containing hydrogen.

The insulating layer 150 may include one or more kinds of substances containing alkaline earth metal and one or more kinds of substances containing hydrogen.

The insulating layer 150 may include one or more kinds of substances containing alkali metal, one or more kinds of substances containing alkaline earth metal, and one or more kinds of substances containing hydrogen.

In the case of forming a film by a plasma CVD method, for example, the substance containing alkali metal, the substance containing alkaline earth metal, or the substance containing hydrogen is made to be included in a film formation gas. Thus, the insulating layer 150 can be formed.

In the case of forming a film by a sputtering method, for example, the substance containing alkali metal, the substance containing alkaline earth metal, or the substance containing hydrogen is made to be included in a sputtering target or a sputtering gas. Thus, the insulating layer 150 can be formed.

For example, a resin film can be used as the insulating layer 150 because the resin film contains a large amount of $H_2O$.

It is highly effective when the substance containing alkali metal or the substance containing alkaline earth metal is made to be included in the resin film.

In each of FIGS. 16 to 18, the oxide semiconductor layer 310 has a region being in contact with the insulating layer 150.

The contact of the oxide semiconductor layer 310 with the insulating layer 150 allows the diffusion of the substance containing alkali metal, the substance containing alkaline earth metal, or the substance containing hydrogen from the insulating layer 150 into the oxide semiconductor layer 310.

The diffusion of the substance containing alkali metal, the substance containing alkaline earth metal, or the substance containing hydrogen from the insulating layer 150 into the oxide semiconductor layer 310 causes generation of carriers in the oxide semiconductor layer 310. Thus, the resistance of the oxide semiconductor layer 310 can be reduced.

The alkali metal concentration, the alkaline earth metal concentration, or the hydrogen concentration in the vicinity of the interface between the oxide semiconductor layer 310 and the insulating layer 150 (the lower portion or the upper portion of the oxide semiconductor layer 310) is particularly high.

That is, the alkali metal concentration in a predetermined region of the oxide semiconductor layer 310 is higher than the alkali metal concentration in a predetermined region of the oxide semiconductor layer 301.

Further, the alkaline earth metal concentration in a predetermined region of the oxide semiconductor layer 310 is higher than the alkaline earth metal concentration in a predetermined region of the oxide semiconductor layer 301.

Furthermore, the hydrogen concentration in a predetermined region of the oxide semiconductor layer 310 is higher than the hydrogen concentration in a predetermined region of the oxide semiconductor layer 301.

In each of FIGS. 15 to 18, the insulating layer 300 and the insulating layer 500 each have a region being in contact with the oxide semiconductor layer 301.

Since the oxide semiconductor layer 301 is the active layer of the transistor Tr, it is preferable to prevent entry of the substance containing alkali metal, the substance containing alkaline earth metal, the substance containing hydrogen, or the like into the oxide semiconductor layer 301.

That is, the alkali metal concentration, the alkaline earth metal concentration, and the hydrogen concentration in the insulating layer 300 and the insulating layer 500 are preferably low.

For example, the sodium concentration in the insulating layer 300 is preferably lower than the sodium concentration in the substrate 101.

For example, the sodium concentration in the insulating layer 500 is preferably lower than the sodium concentration in the substrate 101.

For example, the alkali metal concentration in the insulating layer 300 is preferably lower than the alkali metal concentration in the insulating layer 150.

For example, the alkali metal concentration in the insulating layer 500 is preferably lower than the alkali metal concentration in the insulating layer 150.

For example, the alkaline earth metal concentration in the insulating layer 300 is preferably lower than the alkaline earth metal concentration in the insulating layer 150.

For example, the alkaline earth metal concentration in the insulating layer 500 is preferably lower than the alkaline earth metal concentration in the insulating layer 150.

For example, the hydrogen concentration in the insulating layer 300 is preferably lower than the hydrogen concentration in the insulating layer 150.

For example, the hydrogen concentration in the insulating layer 500 is preferably lower than the hydrogen concentration in the insulating layer 150.

Oxygen is preferably contained in the insulating layer 300 or the insulating layer 500 in order to reduce oxygen vacancies in the oxide semiconductor layer 301.

For example, the oxygen concentration in the insulating layer 300 is preferably higher than the oxygen concentration in the insulating layer 150.

For example, the oxygen concentration in the insulating layer 500 is preferably higher than the oxygen concentration in the insulating layer 150.

The structure shown in FIG. 18 may be combined with any of the structures shown in FIGS. 15 to 17.

For example, the top and the bottom of the oxide semiconductor layer 310 are sandwiched between a pair of insulating layers 150, whereby the resistance value of the oxide semiconductor layer 310 can be greatly reduced.

At least part of the structure described in this embodiment can be combined with at least part of a structure described in any of the other embodiments.

(Embodiment 7)

In the case of FIGS. 15 and 16, when the opening portion of the insulating layer 300 overlaps with the conductive layer 201, the conductive layer 211, the conductive layer 212, the conductive layer 213, and the like, a short circuit occurs between these conductive layers.

However, in the case of FIG. 17, even when the opening portion of the insulating layer 300 overlaps with the conductive layer 201, the conductive layer 211, the conductive layer 212, the conductive layer 213, and the like, a short circuit does not occur between these conductive layers.

In the case of FIG. 18, even when the opening portion of the insulating layer 500 overlaps with the conductive layer 201, the conductive layer 211, the conductive layer 212, the conductive layer 213, and the like, a short circuit does not occur between the conductive layers.

Figure 19:
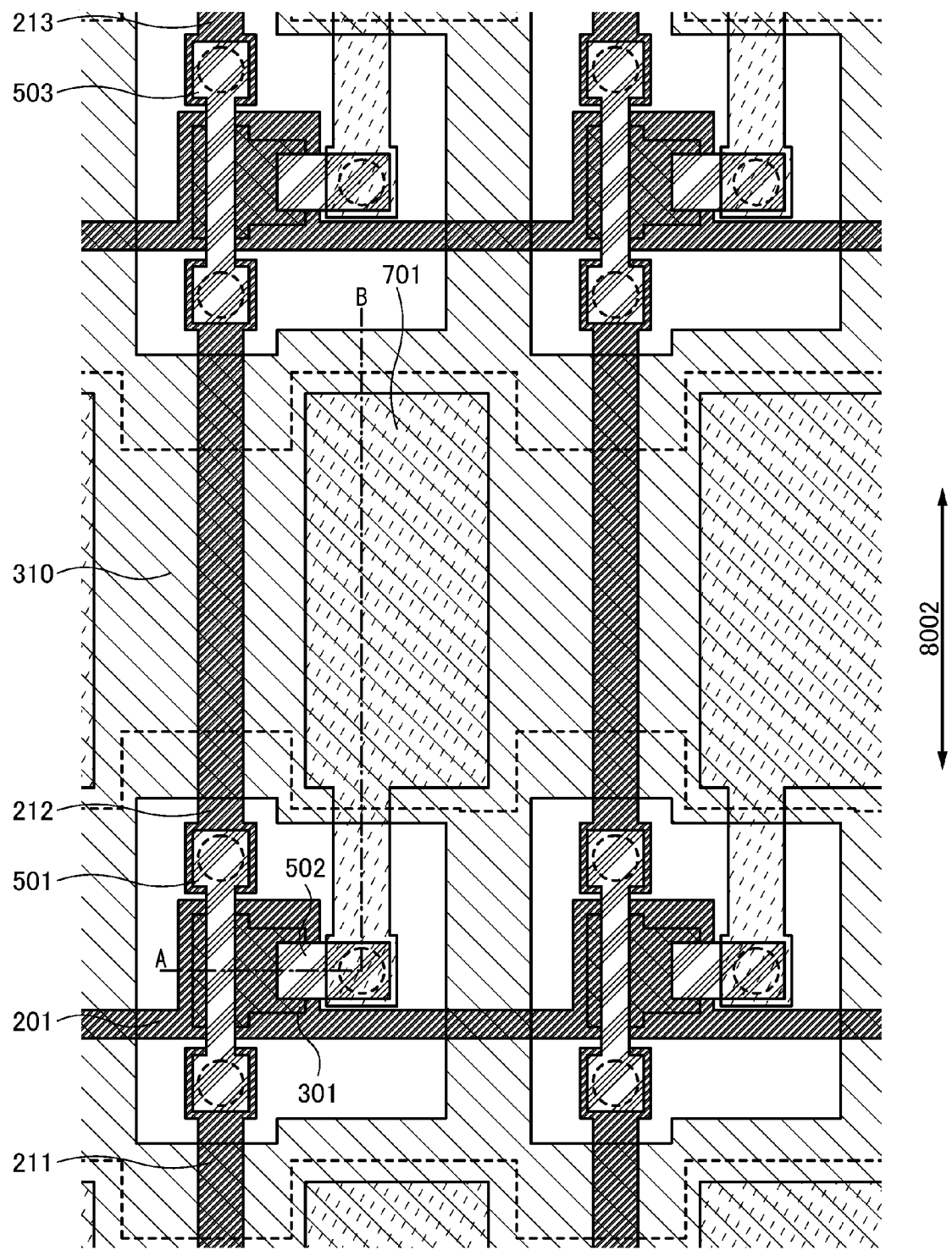
FIG. 19 illustrates an example of a semiconductor device.
Figure 20:
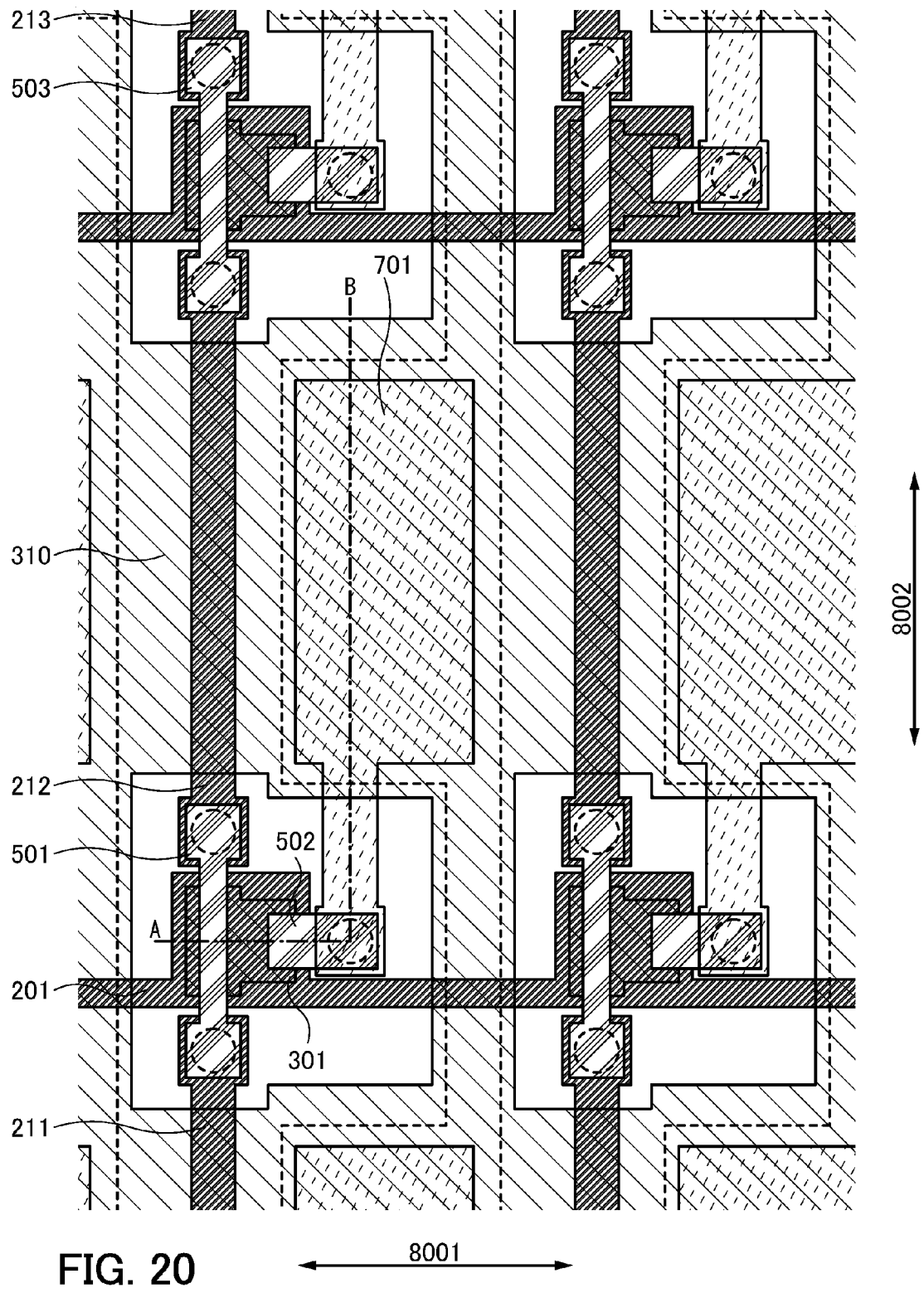
FIG. 20 illustrates an example of a semiconductor device.
Figure 21:
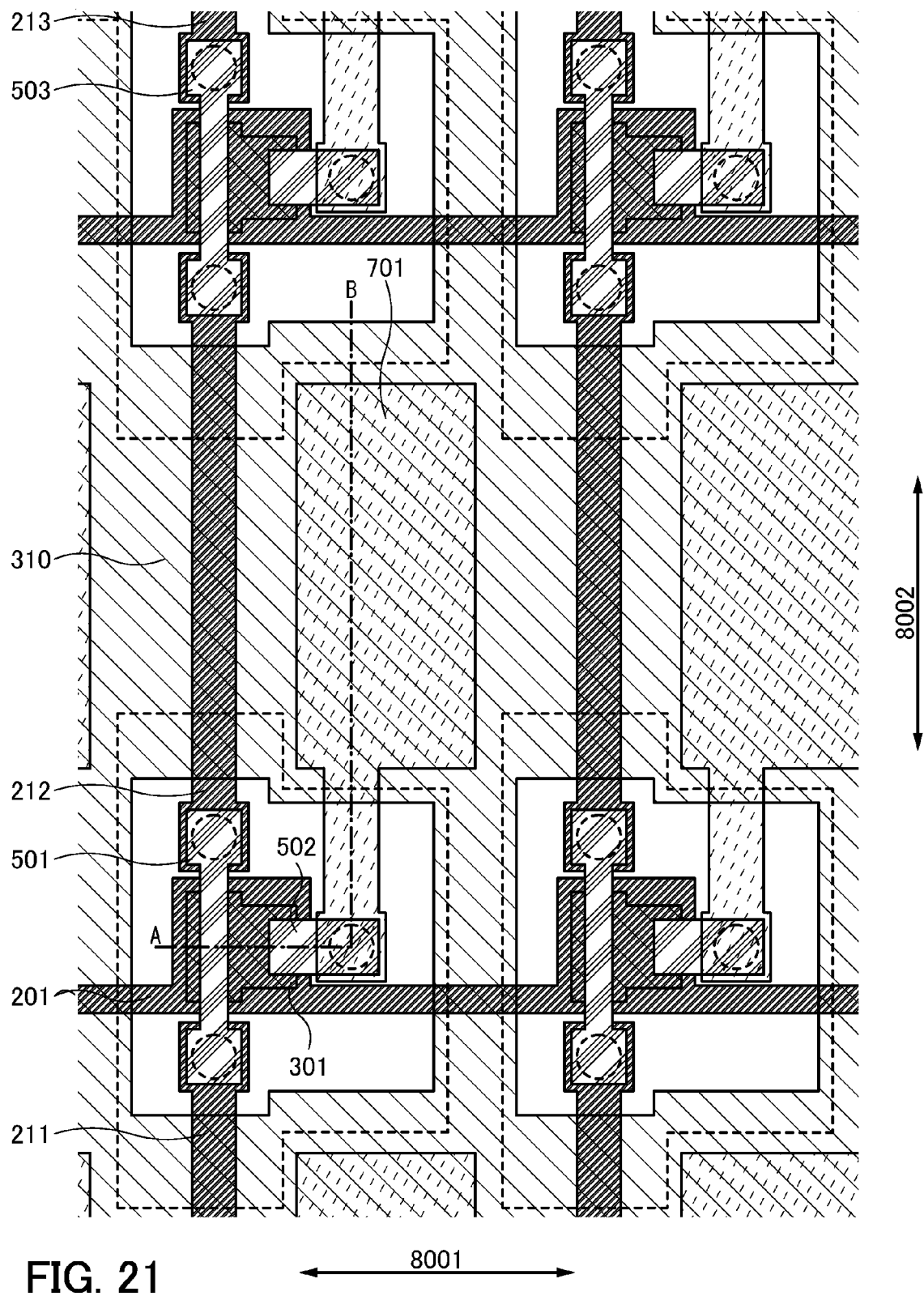
FIG. 21 illustrates an example of a semiconductor device.

In the case of FIG. 17, for example, the opening portion of the insulating layer 300 can have any of shapes as shown in FIGS. 19 to 21.

In the case of FIG. 18, for example, the opening portion of the insulating layer 500 can have any of shapes as shown in FIGS. 19 to 21.

FIG. 19 illustrates an example of the shape of the opening portion which is provided to extend over a plurality of pixels arranged in the first direction 8001.

In FIG. 19, the opening portion has a region overlapping with the conductive layer 212 and the like.

In FIG. 19, the opening portion has a region intersecting with the conductive layer 212 and the like.

FIG. 20 illustrates an example of the shape of the opening portion which is provided to extend over a plurality of pixels arranged in the second direction 8002.

In FIG. 20, the opening portion has a region overlapping with the conductive layer 201 and the like.

In FIG. 20, the opening portion has a region intersecting with the conductive layer 201 and the like.

FIG. 21 illustrates an example of the shape of the opening portion which is provided across all the pixels.

In FIG. 21, the opening portion has a region overlapping with the conductive layer 201, the conductive layer 211, the conductive layer 212, the conductive layer 213, and the like.

In FIG. 21, the opening portion has a region intersecting with the conductive layer 201, the conductive layer 211, the conductive layer 212, the conductive layer 213, and the like.

With the structure as shown in each of FIGS. 19 to 21, the area of contact between the insulating layer 150 and the oxide semiconductor layer 310 can be increased.

By the increase of the area of contact between the insulating layer 150 and the oxide semiconductor layer 310, the resistance value of the oxide semiconductor layer 310 can be further reduced.

The opening portion means a hole or a groove.

A hole has a closed shape.

A groove has an open shape.

The opening portion shown in each of FIGS. 19 to 21 may be either a hole or a groove.

At least part of the structure described in this embodiment can be combined with at least part of a structure described in any of the other embodiments.

(Embodiment 8)

Figure 22:
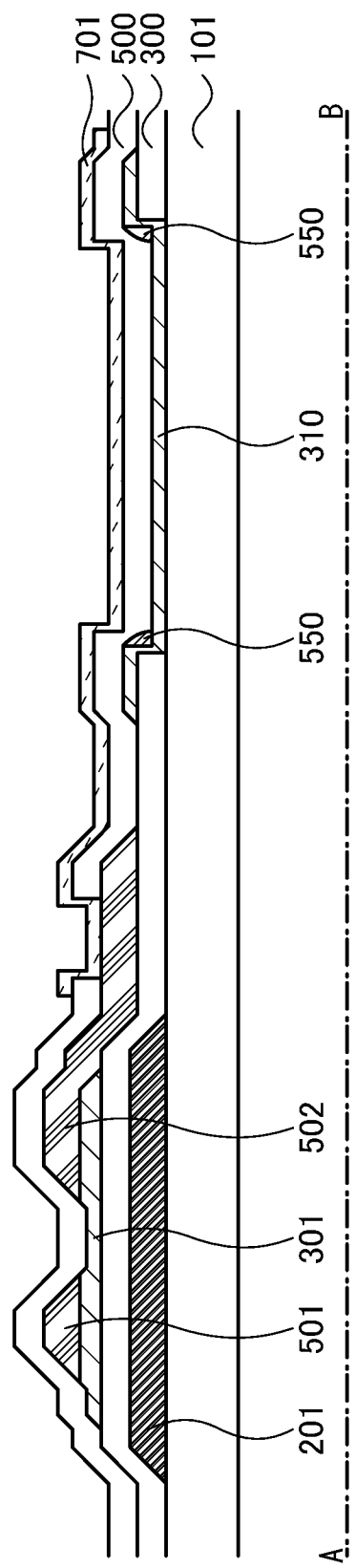
FIG. 22 illustrates an example of the semiconductor device.

FIG. 22 illustrates an example of a drawing which is different from FIG. 15 in that a conductive layer 550 and the like are provided.

Figure 23:
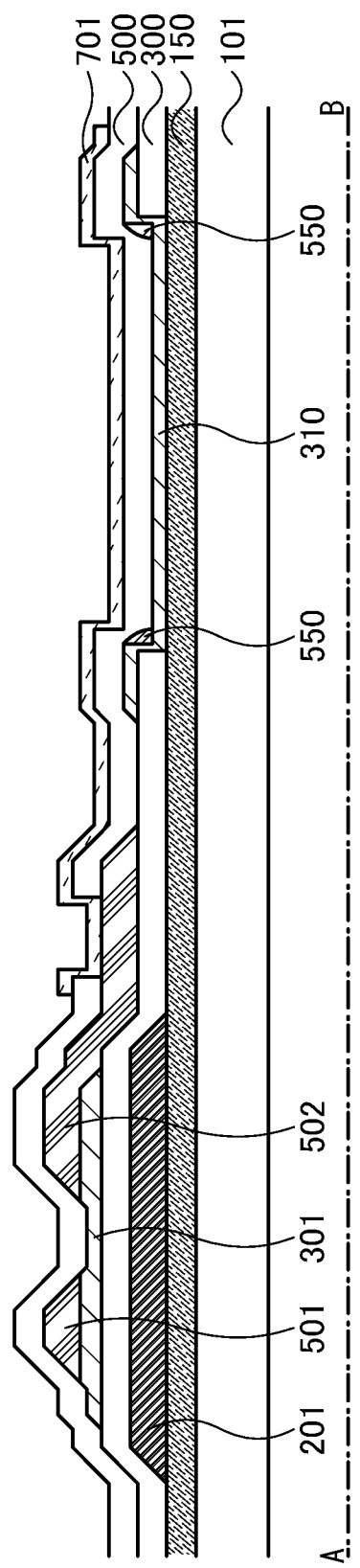
FIG. 23 illustrates an example of the semiconductor device.

FIG. 23 illustrates an example of a drawing which is different from FIG. 16 in that the conductive layer 550 and the like are provided.

Figure 24:
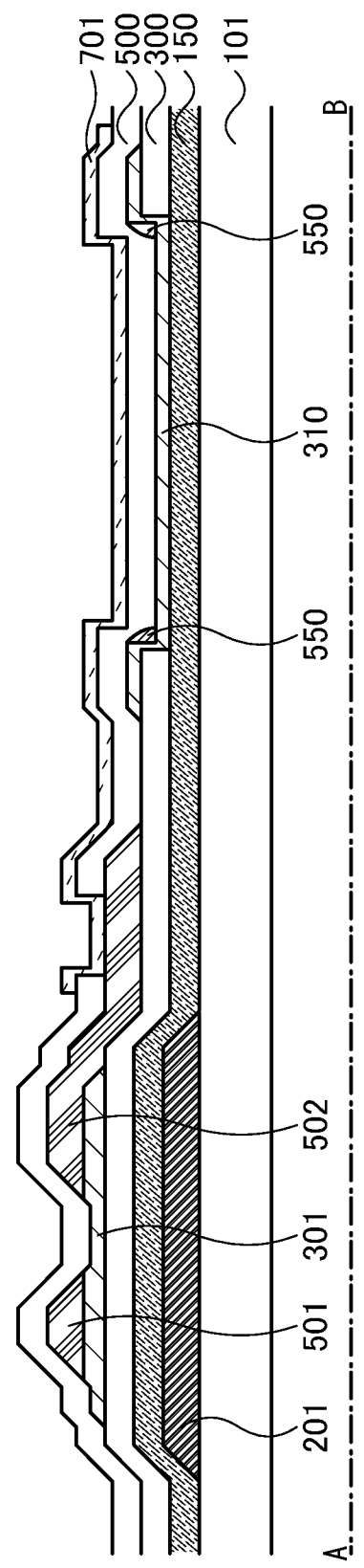
FIG. 24 illustrates an example of the semiconductor device.

FIG. 24 illustrates an example of a drawing which is different from FIG. 17 in that the conductive layer 550 and the like are provided.

At least part of the conductive layer 550 can function as an auxiliary wiring.

A method for forming the conductive layer 550 is described.

The conductive layer 501, the conductive layer 502, and the like are formed in such a manner that, after a conductive film is formed over an entire surface of the substrate, the conductive film is processed by etching with a mask provided in a position where the conductive layer 501, the conductive layer 502, and the like are to be formed.

Here, in general, etching time is adjusted so that a conductive layer is not left in a position except the position where the conductive layer 501, the conductive layer 502, and the like are to be formed.

However, etching time is intentionally shortened, whereby the conductive layer 550 can be left in the edge portion (the step portion) of the opening portion.

That is, by utilizing a property such that a residue is easily left in the edge portion (the step portion) of the opening portion, the conductive layer 550 can be formed.

The conductive layer 550 can also be referred to as a conductive sidewall.

In each of FIGS. 22 to 24, the oxide semiconductor layer 310 has a recessed portion in a position overlapping with the opening portion.

The conductive layer 550 has a region being in contact with the side surface of the oxide semiconductor layer 310 in an inside of the recessed portion.

The conductive layer 550 has a region being in contact with the top surface of the oxide semiconductor layer 310 in an inside of the recessed portion.

At least part of the structure described in this embodiment can be combined with at least part of a structure described in any of the other embodiments.

(Embodiment 9)

Figure 25:
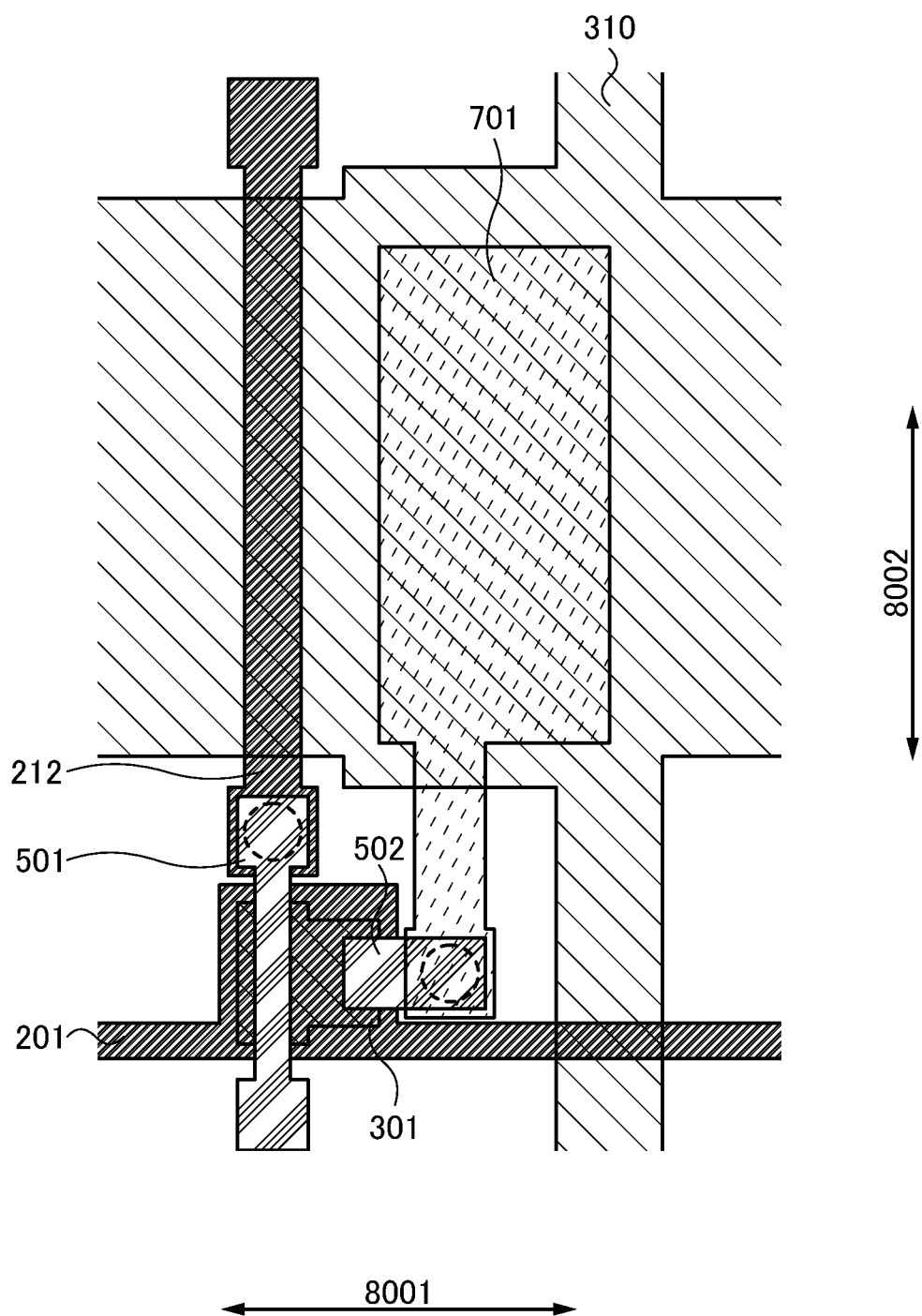
FIG. 25 illustrates an example of a semiconductor device.

FIG. 25 illustrates an example of at least part of one pixel in FIG. 1.

Figure 26:
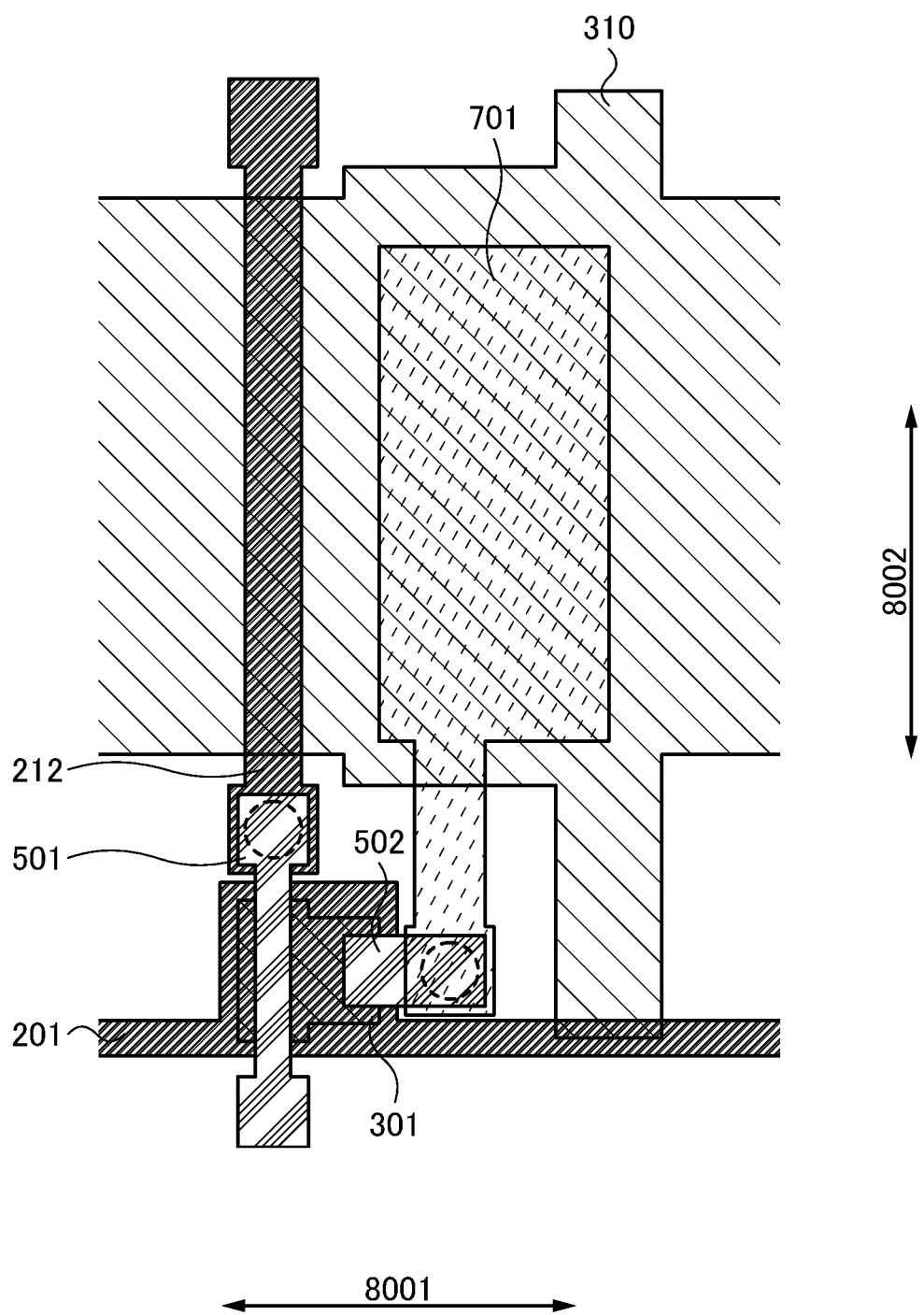
FIG. 26 illustrates an example of a semiconductor device.

FIG. 26 illustrates an example of at least part of one pixel in FIG. 12.

Figure 27:
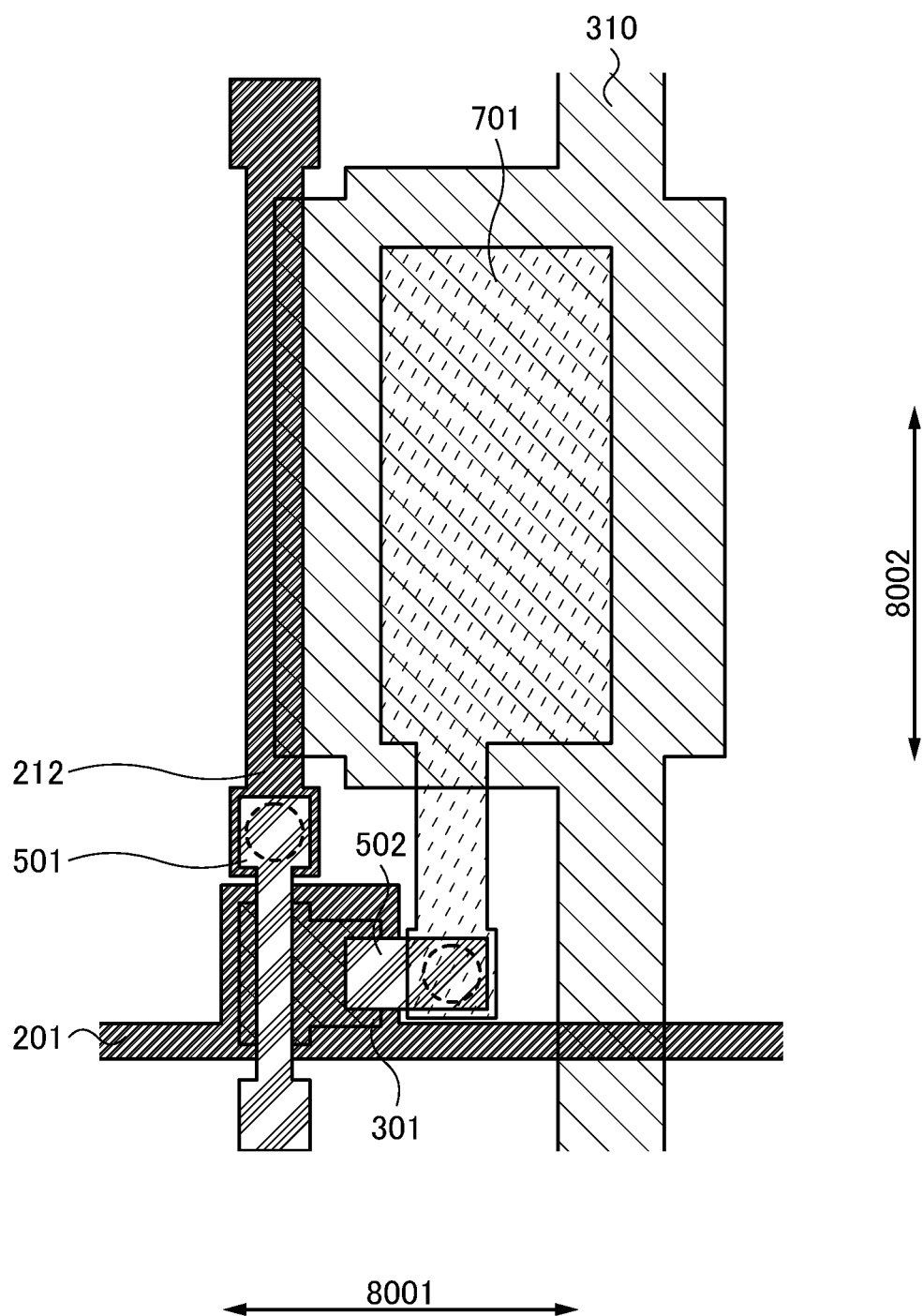
FIG. 27 illustrates an example of a semiconductor device.

FIG. 27 illustrates an example of at least part of one pixel in FIG. 13.

In FIG. 25, the oxide semiconductor layer 310 has a region overlapping with the conductive layer 212.

In FIG. 25, the oxide semiconductor layer 310 has a region intersecting with the conductive layer 212.

In FIG. 25, the oxide semiconductor layer 310 has a region overlapping with the conductive layer 201.

In FIG. 25, the oxide semiconductor layer 310 has a region intersecting with the conductive layer 201.

In FIG. 26, the oxide semiconductor layer 310 has a region overlapping with the conductive layer 212.

In FIG. 26, the oxide semiconductor layer 310 has a region intersecting with the conductive layer 212.

In FIG. 26, the oxide semiconductor layer 310 has a region overlapping with the conductive layer 201.

In FIG. 26, the oxide semiconductor layer 310 does not intersect with the conductive layer 201.

In FIG. 27, the oxide semiconductor layer 310 has a region overlapping with the conductive layer 212.

In FIG. 27, the oxide semiconductor layer 310 does not intersect with the conductive layer 212.

In FIG. 27, the oxide semiconductor layer 310 has a region overlapping with the conductive layer 201.

In FIG. 27, the oxide semiconductor layer 310 has a region intersecting with the conductive layer 201.

By making the oxide semiconductor layer 310 intersect with the conductive layer 212 or the conductive layer 201, the oxide semiconductor layer 310 can be provided to extend over a plurality of pixels.

By making the oxide semiconductor layer 310 overlap with the conductive layer 212 or the conductive layer 201, the area of the oxide semiconductor layer 310 can be increased. Thus, the resistance value of the oxide semiconductor layer 310 can be reduced.

At least part of the structure described in this embodiment can be combined with at least part of a structure described in any of the other embodiments.

(Embodiment 10)

Figure 28:
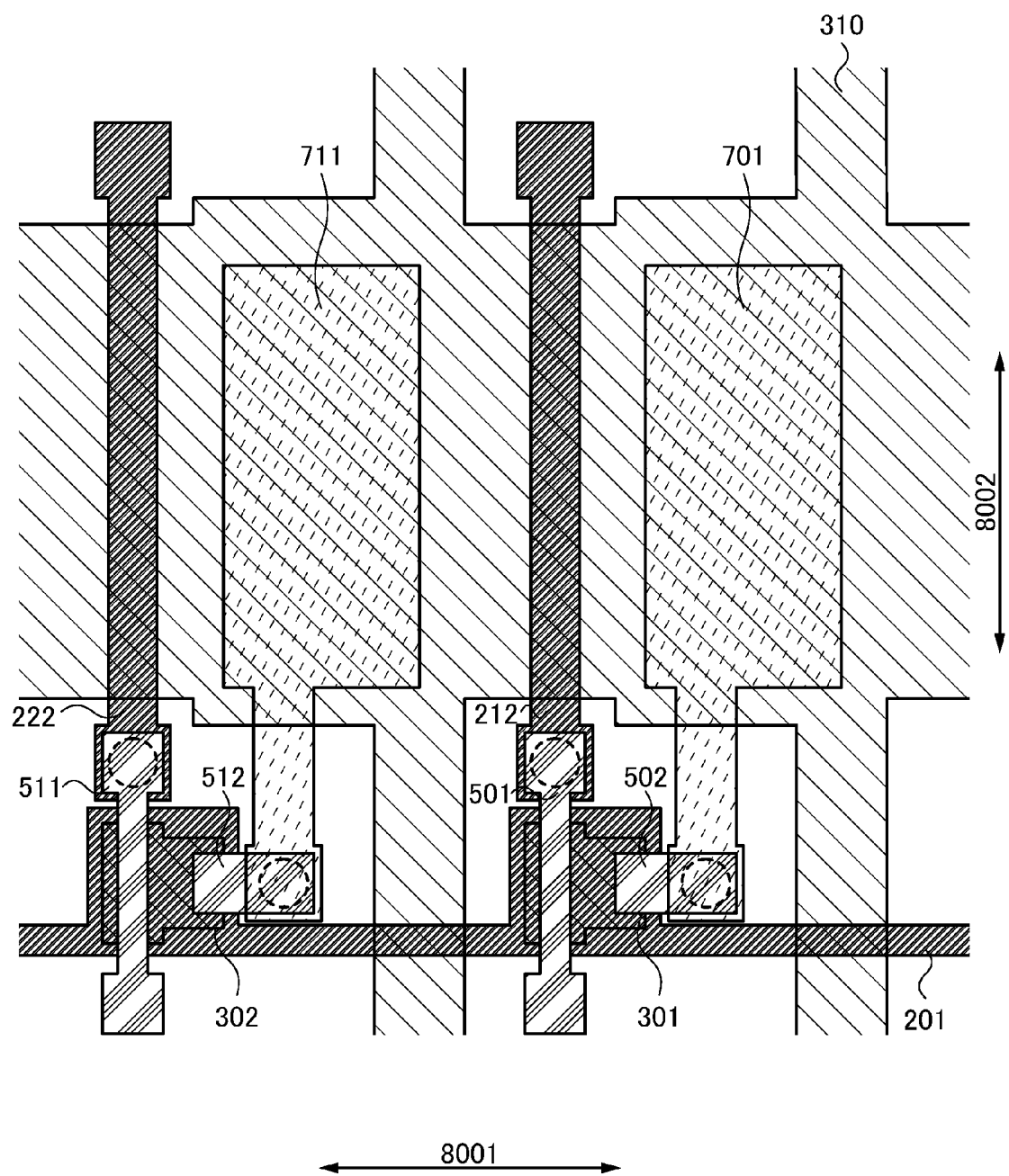
FIG. 28 illustrates an example of a semiconductor device.

FIG. 28 illustrates an example of at least part of two pixels in FIG. 1.

Figure 29:
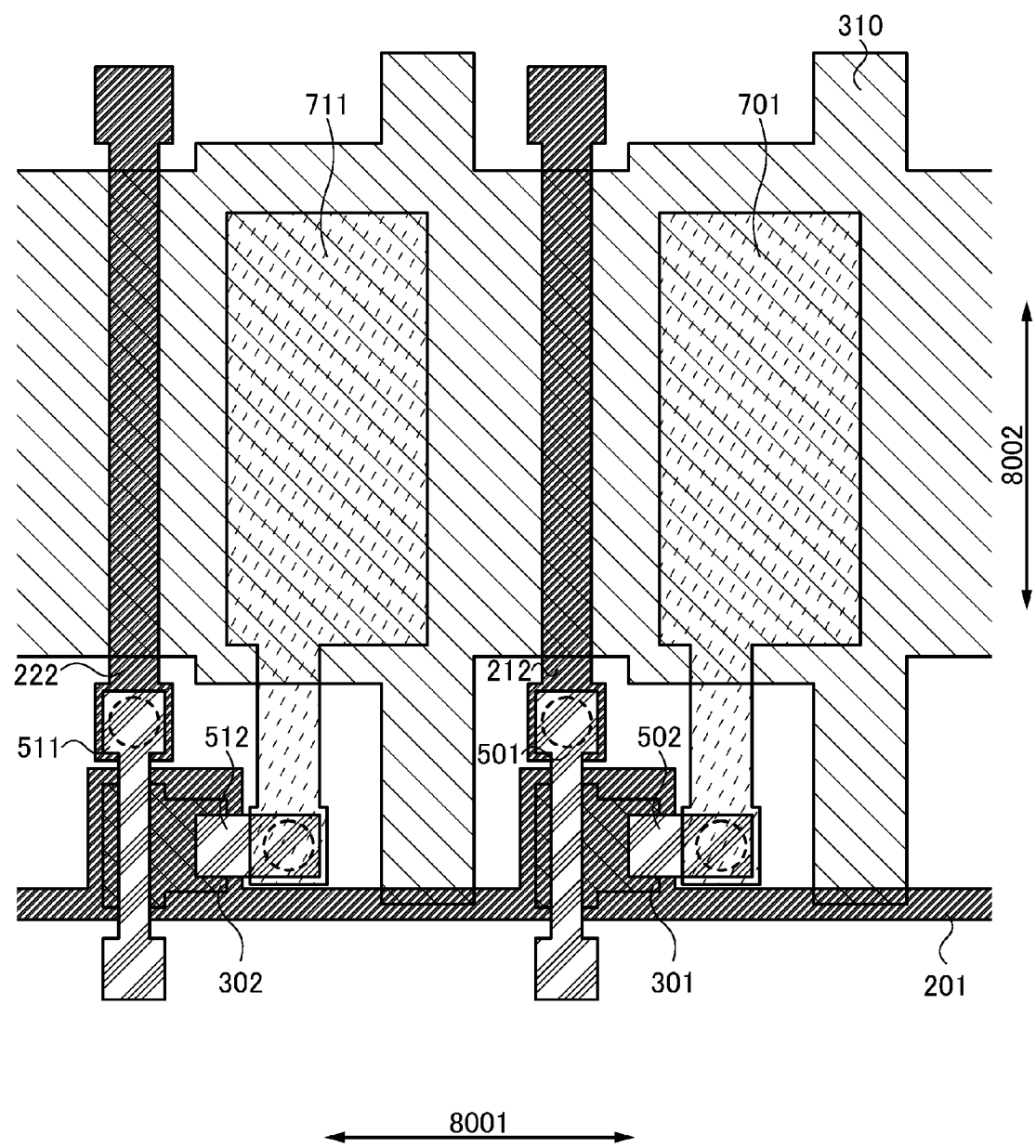
FIG. 29 illustrates an example of a semiconductor device.

FIG. 29 illustrates an example of at least part of two pixels in FIG. 12.

A conductive layer 222 is preferably formed in the same step as the conductive layer 201.

An oxide semiconductor layer 302 is preferably formed in the same step as the oxide semiconductor layer 301.

A conductive layer 511 is preferably formed in the same step as the conductive layer 501.

A conductive layer 512 is preferably formed in the same step as the conductive layer 501.

A conductive layer 711 is preferably formed in the same step as the conductive layer 701.

In each of FIGS. 28 and 29, the oxide semiconductor layer 310 has a region overlapping with the conductive layer 701.

In each of FIGS. 28 and 29, the oxide semiconductor layer 310 has a region overlapping with the conductive layer 711.

In each of FIGS. 28 and 29, the oxide semiconductor layer 310 has a region overlapping with the conductive layer 212.

In each of FIGS. 28 and 29, the oxide semiconductor layer 310 has a region intersecting with the conductive layer 212.

In each of FIGS. 28 and 29, the oxide semiconductor layer 310 has a region overlapping with the conductive layer 222.

In each of FIGS. 28 and 29, the oxide semiconductor layer 310 has a region intersecting with the conductive layer 222.

In each of FIGS. 28 and 29, the oxide semiconductor layer 310 has a region overlapping with the conductive layer 201.

In FIG. 28, the oxide semiconductor layer 310 has a region intersecting with the conductive layer 201.

In FIG. 29, the oxide semiconductor layer 310 does not intersect with the conductive layer 201.

With the structure as shown in any of FIGS. 28 and 29, the oxide semiconductor layer 310 can be provided to extend over a plurality of pixels.

With the structure as shown in any of FIGS. 28 and 29, the resistance value of the oxide semiconductor layer 310 can be reduced.

At least part of the structure described in this embodiment can be combined with at least part of a structure described in any of the other embodiments.

(Embodiment 11)

Figure 30:
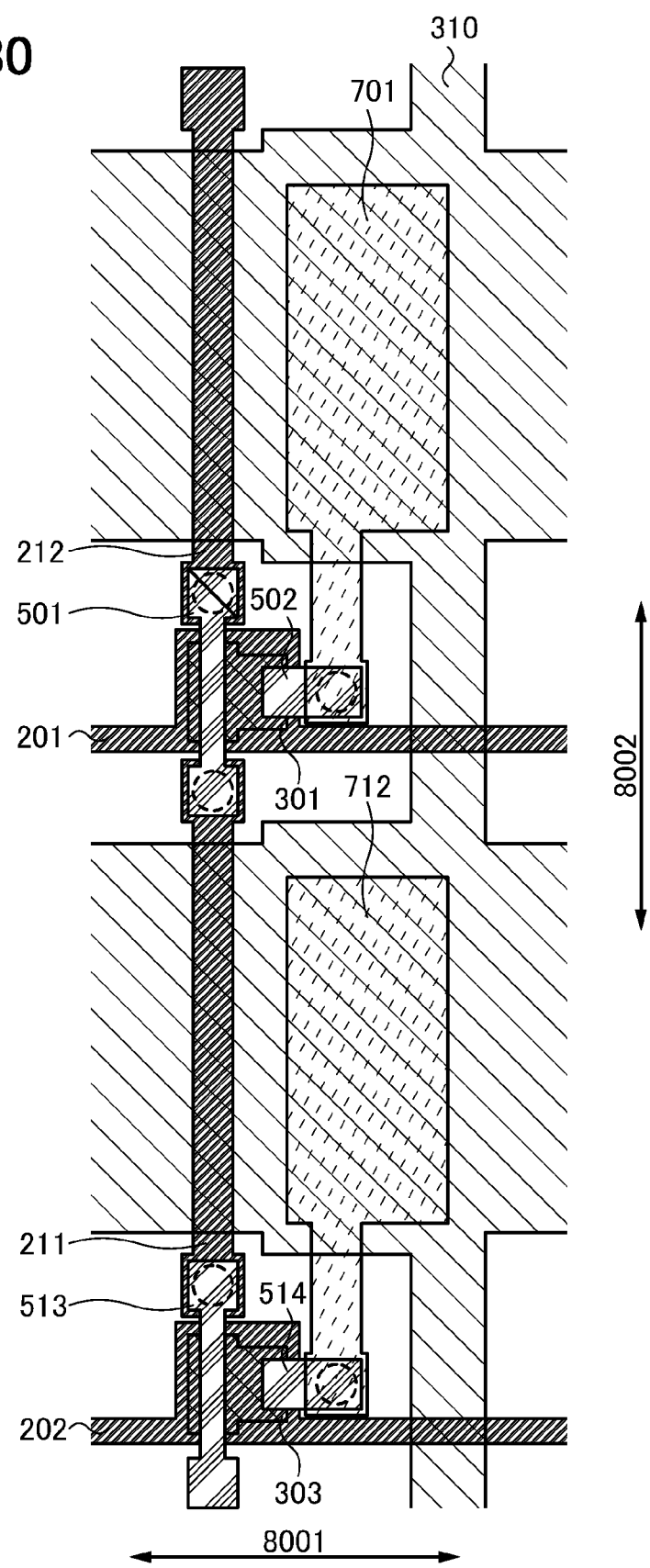
FIG. 30 illustrates an example of a semiconductor device.

FIG. 30 illustrates an example of at least part of two pixels in FIG. 1.

Figure 31:
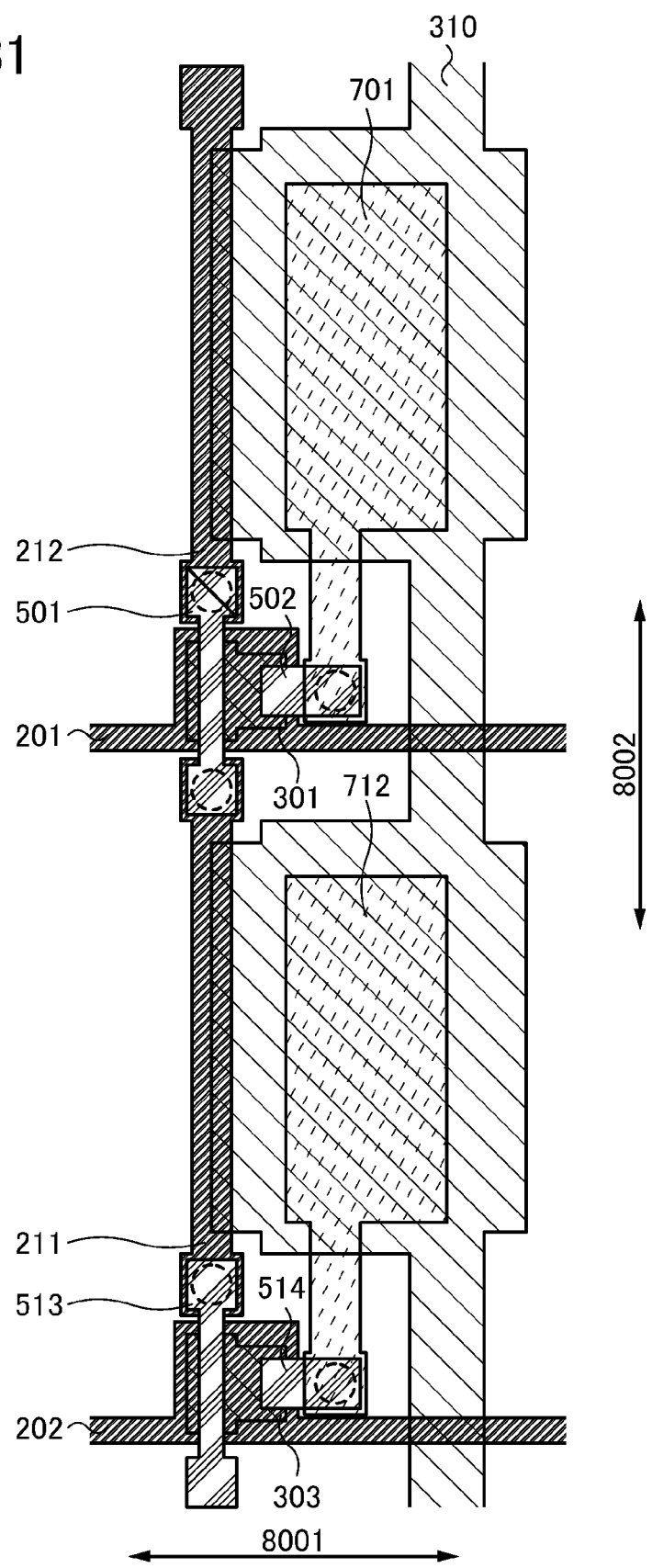
FIG. 31 illustrates an example of a semiconductor device.

FIG. 31 illustrates an example of at least part of two pixels in FIG. 13.

A conductive layer 202 is a conductive layer formed in the same step as the conductive layer 201.

An oxide semiconductor layer 303 is preferably formed in the same step as the oxide semiconductor layer 301.

A conductive layer 513 is a conductive layer formed in the same step as the conductive layer 501.

A conductive layer 514 is a conductive layer formed in the same step as the conductive layer 501.

A conductive layer 712 is a conductive layer formed in the same step as the conductive layer 701.

In each of FIGS. 30 and 31, the oxide semiconductor layer 310 has a region overlapping with the conductive layer 701.

In each of FIGS. 30 and 31, the oxide semiconductor layer 310 has a region overlapping with the conductive layer 712.

In each of FIGS. 30 and 31, the oxide semiconductor layer 310 has a region overlapping with the conductive layer 201.

In each of FIGS. 30 and 31, the oxide semiconductor layer 310 has a region intersecting with the conductive layer 201.

In each of FIGS. 30 and 31, the oxide semiconductor layer 310 has a region overlapping with the conductive layer 202.

In each of FIGS. 30 and 31, the oxide semiconductor layer 310 has a region intersecting with the conductive layer 202.

In each of FIGS. 30 and 31, the oxide semiconductor layer 310 has a region overlapping with the conductive layer 211.

In FIG. 30, the oxide semiconductor layer 310 has a region intersecting with the conductive layer 211.

In FIG. 31, the oxide semiconductor layer 310 does not intersect with the conductive layer 211.

In each of FIGS. 30 and 31, the oxide semiconductor layer 310 has a region overlapping with the conductive layer 212.

In FIG. 30, the oxide semiconductor layer 310 has a region intersecting with the conductive layer 212.

In FIG. 31, the oxide semiconductor layer 310 does not intersect with the conductive layer 212.

With the structure as shown in FIGS. 30 and 31, the oxide semiconductor layer 310 can be provided to extend over a plurality of pixels.

With the structure as shown in FIGS. 30 and 31, the resistance value of the oxide semiconductor layer 310 can be reduced.

Figure 32:
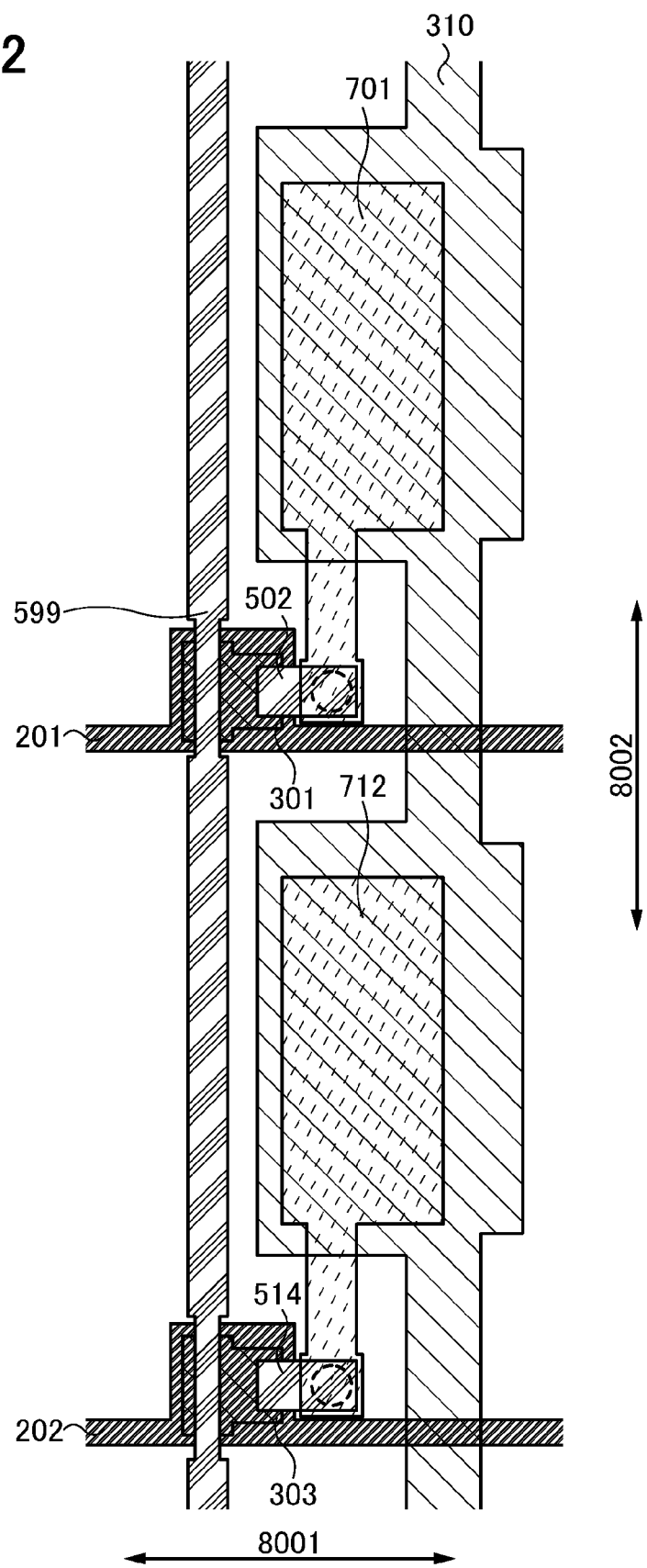
FIG. 32 illustrates an example of a semiconductor device.

A conductive layer 599 shown in FIG. 32 can be provided instead of the conductive layers (the conductive layer 211, the conductive layer 212, the conductive layer 501, the conductive layer 513, and the like) corresponding to the wiring L2 in FIG. 31.

The conductive layer 599 can be formed in the same process as the conductive layer 501, the conductive layer 502, and the like.

In the case of FIG. 32, when the oxide semiconductor layer 310 overlaps with the conductive layer 599, a short circuit occurs between the oxide semiconductor layer 310 and the conductive layer 599. Therefore, it is preferable that the oxide semiconductor layer 310 do not overlap with the conductive layer 599.

At least part of the structure described in this embodiment can be combined with at least part of a structure described in any of the other embodiments.

(Embodiment 12)

Materials for the substrate, the insulating layer, the conductive layer, and the oxide semiconductor layer are described.

A glass substrate, a quartz substrate, a metal substrate, a semiconductor substrate, a resin substrate (a plastic substrate), or the like can be used for the substrate, but the substrate is not limited to these examples.

It is preferable to use a glass substrate containing sodium in the case where the oxide semiconductor layer 310 and the substrate are made to be in contact with each other.

It is also preferable to use a resin substrate (a plastic substrate) in the case where the oxide semiconductor layer 310 and the substrate are made to be in contact with each other, because the resin substrate (the plastic substrate) contains a large amount of $H_2O$.

It is further preferable to use a resin substrate (a plastic substrate) containing alkali metal or alkaline earth metal in the case where the oxide semiconductor layer 310 and the substrate are made to be in contact with each other.

The substrate may have flexibility.

A glass substrate becomes flexible by being thinned.

A resin substrate has flexibility.

As the insulating layer, any material having an insulating property can be used.

The insulating layer may have either a single layer structure or a layered structure.

Examples of the insulating layer include an insulating layer containing an inorganic substance and an insulating layer containing an organic substance, but the insulating layer is not limited to these examples.

Examples of the insulating layer containing an inorganic substance include a film containing silicon oxide (typically, a silicon oxide film, a silicon oxide film containing nitrogen, and the like), a film containing silicon nitride (typically, a silicon nitride film, a silicon nitride film containing oxygen, and the like), a film containing aluminum nitride (typically, an aluminum nitride film, an aluminum nitride film containing oxygen, and the like), a film containing aluminum oxide (typically, an aluminum oxide film, an aluminum oxide film containing nitrogen, and the like), and a film containing hafnium oxide (typically, a hafnium oxide film and the like), but the insulating layer containing an inorganic substance is not limited to these examples.

Examples of the insulating layer containing an organic substance include a resin film.

Examples of the resin film include a film containing polyimide (typically, a polyimide film and the like), a film containing acrylic (typically, an acrylic film and the like), a film containing siloxane (typically, a siloxane film and the like), and a film containing epoxy (typically, an epoxy film and the like), but the resin film is not limited to these examples.

The insulating layer containing an inorganic substance is preferably used as the insulating layer capable of functioning as the gate insulating film.

The conductive layer can be formed using any material having a conductive property.

The conductive layer may have a single-layer structure or a layered structure.

Examples of the conductive layer include a film containing metal (typically, a metal film, an alloy film, or the like) and a film containing a transparent conductor (typically, a transparent conductive film or the like), but the conductive layer is not limited to these examples.

Examples of the metal include aluminum, titanium, molybdenum, tungsten, chromium, gold, silver, copper, alkali metal, and alkaline earth metal, but the metal is not limited to these examples.

Examples of the transparent conductor include indium tin oxide and indium zinc oxide, but the transparent conductor is not limited to these examples.

Metal has a light-blocking property or a reflective property.

A transparent conductor has a light-transmitting property.

In the case where the conductive layer capable of functioning as an electrode of a display element has a light-transmitting property like the conductive layer 701, a transmissive display device can be fabricated.

For example, the conductive layer 701 is preferably formed using a film containing a transparent conductor.

In the case where the conductive layer 701 is formed using a film containing metal, a reflective display device can be fabricated.

The oxide semiconductor layer can be formed using any material having semiconductor characteristics.

The oxide semiconductor layer may have a single-layer structure or a layered structure.

A semiconductor layer except the oxide semiconductor layer may be used.

Examples of the semiconductor layer except the oxide semiconductor layer include a semiconductor layer containing silicon and an organic semiconductor layer, but the semiconductor layer except the oxide semiconductor layer is not limited to these examples.

Examples of the semiconductor layer containing silicon include a silicon film, a silicon germanium film, and a silicon carbide film, but the semiconductor layer containing silicon is not limited to these examples.

The oxide semiconductor layer except the oxide semiconductor layer may have a single-layer structure or a layered structure.

The oxide semiconductor layer is a film containing an oxide semiconductor material.

The oxide semiconductor layer is not limited in particular as long as the oxide semiconductor layer is a film containing metal and oxygen.

For example, a film containing indium and oxygen, a film containing zinc and oxygen, a film containing tin and oxygen, or the like can function as the oxide semiconductor layer.

Examples of the oxide semiconductor layer include an indium oxide film, a tin oxide film, and a zinc oxide film, but the oxide semiconductor layer is not limited to these examples.

For example, as the oxide semiconductor layer, an In—Zn-based oxide film, a Sn—Zn-based oxide film, an Al—Zn-based oxide film, a Zn—Mg-based oxide film, a Sn—Mg-based oxide film, an In—Mg-based oxide film, and an In—Ga-based oxide film are given, but the oxide semiconductor layer is not limited to these examples.

The term "A-B-based oxide film" (A and B are elements) means a film containing A, B, and oxygen.

For example, as the oxide semiconductor layer, an In—Ga—Zn-based oxide film, an In—Sn—Zn-based oxide film, a Sn—Ga—Zn-based oxide film, an In—Al—Zn-based oxide film, an In—Hf—Zn-based oxide film, an In—La—Zn-based oxide film, an In—Ce—Zn-based oxide film, an In—Pr—Zn-based oxide film, an In—Nd—Zn-based oxide film, an In—Sm—Zn-based oxide film, an In—Eu—Zn-based oxide film, an In—Gd—Zn-based oxide film, an In—Tb—Zn-based oxide film, an In—Dy—Zn-based oxide film, an In—Ho—Zn-based oxide film, an In—Er—Zn-based oxide film, an In—Tm—Zn-based oxide film, an In—Yb—Zn-based oxide film, an In—Lu—Zn-based oxide film, an Al—Ga—Zn-based oxide film, a Sn—Al—Zn-based oxide film, and the like are given, but the oxide semiconductor layer is not limited to these examples.

The term "A-B-C-based oxide film" (A, B, and C are elements) means a film containing A, B, C, and oxygen.

For example, as the oxide semiconductor layer, an In—Sn—Ga—Zn-based oxide film, an In—Hf—Ga—Zn-based oxide film, an In—Al—Ga—Zn-based oxide film, an In—Sn—Al—Zn-based oxide film, an In—Sn—Hf—Zn-based oxide film, an In—Hf—Al—Zn-based oxide film, and the like are given, but the oxide semiconductor layer is not limited to these examples.

The term "A-B-C-D-based oxide film" (A, B, C, and D are elements) means a film containing A, B, C, D, and oxygen.

As the oxide semiconductor layer, a film containing indium, gallium, zinc, and oxygen is particularly preferable.

An n-channel transistor and a p-channel transistor can each be fabricated with the use of the oxide semiconductor layer. However, an n-channel transistor is preferable to a p-channel transistor in terms of practical use.

The oxide semiconductor layer preferably has a crystal.

The crystal is preferably aligned so that the direction of its c-axis is perpendicular to a surface of the oxide semiconductor layer or the substrate.

The crystal whose c-axis is aligned to be perpendicular to the surface of the oxide semiconductor layer or the substrate is referred to as a c-axis aligned crystal (CAAC).

An angle between the c-axis of the crystal and the surface of the oxide semiconductor layer or the substrate is preferably 90°, but it may be greater than or equal to 80° and less than or equal to 100°.

As an example of a method for forming the CAAC, there is a first method in which a substrate temperature at the time of forming the oxide semiconductor layer by a sputtering method is set to higher than or equal to 200° C. and lower than or equal to 450° C.

In the first method, the CAAC is formed in the lower portion and the upper portion of the oxide semiconductor layer.

As another example of the method for forming the CAAC, there is a second method in which, after the oxide semiconductor layer is formed, the oxide semiconductor layer is subjected to heat treatment at higher than or equal to 650° C. for 3 minutes or longer.

In the second method, the CAAC is formed at least in the upper portion of the oxide semiconductor layer (a pattern A of the second method).

In the second method, the oxide semiconductor layer having a small thickness is used; thus, the CAAC can be formed in the lower portion and the upper portion of the oxide semiconductor layer (a pattern B of the second method).

As another example of the method for forming the CAAC, there is a third method in which a second oxide semiconductor layer is formed over a first oxide semiconductor layer that is formed using the pattern B of the second method.

The method for forming the oxide semiconductor layer in the second method and the third method is not limited to a sputtering method.

The first to the third methods enable a crystal to be formed, and an angle which the c-axis of the crystal forms with the surface of the oxide semiconductor layer or the substrate is greater than or equal to 80° and less than or equal to 100°.

By the first to the third methods, it is possible to form the CAAC at least in the upper portion (the surface) of the oxide semiconductor layer.

Since the oxide semiconductor layer including the CAAC is dense, $H_2O$, H, or the like can be blocked.

The oxide semiconductor layer being in contact with the insulating layer 150 preferably has an amorphous part.

In the case where an oxide semiconductor layer including the CAAC is used as the oxide semiconductor layer, at least part of the oxide semiconductor layer being in contact with the resin layer can be made amorphous by performing plasma treatment on the oxide semiconductor layer being in contact with the resin layer.

Plasma treatment is preferably not performed on the oxide semiconductor layer which is not in contact with the insulating layer 150 so that $H_2O$ is not contained in the oxide semiconductor layer which is not in contact with the insulating layer 150.

As the plasma treatment, hydrogen plasma treatment, rare gas plasma treatment, halogen plasma treatment, and the like are given as examples, but the plasma treatment is not limited to these examples.

The crystalline state of the oxide semiconductor layer which is not in contact with the insulating layer 150 is preferably different from the crystalline state of the oxide semiconductor layer which is in contact with the insulating layer 150.

For example, the oxide semiconductor layer which is in contact with the insulating layer 150 is made to have a crystalline state such that entry of $H_2O$ or H into the oxide semiconductor layer which is in contact with the insulating layer 150 is easier than entry of $H_2O$ or H into the oxide semiconductor layer which is not in contact with the insulating layer 150. Thus, the resistivity of the oxide semiconductor layer which is in contact with the insulating layer 150 can be lower than the resistivity of the oxide semiconductor layer which is not in contact with the insulating layer 150.

For example, the oxide semiconductor layer including the CAAC is used for the oxide semiconductor layer which is not in contact with the insulating layer 150. For example, a non-single-crystal oxide semiconductor layer, such as an amorphous oxide semiconductor layer, a microcrystalline oxide semiconductor layer, or a polycrystalline oxide semiconductor layer, is used for the oxide semiconductor layer which is in contact with the insulating layer 150.

Examples of the microcrystalline oxide semiconductor layer include a nanocrystalline oxide semiconductor layer and a microcrystal oxide semiconductor layer.

For example, the oxide semiconductor layer which is in contact with the insulating layer 150 is made to have higher crystallinity than the oxide semiconductor layer which is not in contact with the insulating layer 150. Thus, the resistivity of the oxide semiconductor layer which is in contact with the insulating layer 150 can be lower than the resistivity of the oxide semiconductor layer which is not in contact with the insulating layer 150.

Particularly in the case where the oxide semiconductor layer including the CAAC is used for the oxide semiconductor layer which is not in contact with the insulating layer 150, a single crystal oxide semiconductor layer can be used for the oxide semiconductor layer which is in contact with the insulating layer 150.

A difference in crystalline states can be observed by electron diffraction or the like.

For example, it can be said that different electron diffraction patterns are indicative of different crystalline states.

A method for making the crystalline state of the oxide semiconductor layer which is not in contact with the insulating layer 150 different from the crystalline state of the oxide semiconductor layer which is in contact with the insulating layer 150 is not particularly limited.

For example, after the oxide semiconductor layer which is not in contact with the insulating layer 150 and the oxide semiconductor layer which is in contact with the insulating layer 150 are concurrently formed, a crystal in one of the oxide semiconductor layer which is not in contact with the insulating layer 150 and the oxide semiconductor layer which is in contact with the insulating layer 150 is destroyed. Thus, the crystalline state of the oxide semiconductor layer which is not in contact with the insulating layer 150 can be made different from the crystalline state of the oxide semiconductor layer which is in contact with the insulating layer 150.

Examples of the method for destroying the crystal include plasma treatment, an ion doping method, and an ion implantation method, but the method is not limited to these examples.

For example, the oxide semiconductor layer which is not in contact with the insulating layer 150 and the oxide semiconductor layer which is in contact with the insulating layer 150 are formed by different methods. Thus, the crystalline state of the oxide semiconductor layer which is not in contact with the insulating layer 150 can be made different from the crystalline state of the oxide semiconductor layer which is in contact with the insulating layer 150.

The phrase "B over A" means that at least part of B is located above A.

At least part of the structure described in this embodiment can be combined with at least part of a structure described in any of the other embodiments.

(Embodiment 13)

An inversed staggered transistor is described in any of the other embodiments. However, the structure of the transistor is not limited thereto.

For example, a structure in which a source electrode and a drain electrode are provided between a gate insulating film and an active layer may be used.

For example, a staggered transistor may be used.

For example, a bottom-gate transistor may be used, a top-gate transistor may be used, or a double-gate transistor including gate electrodes over and under an active layer may be used.

The specific structure of the bottom-gate transistor is not limited. The specific structure of the top-gate transistor is not limited. The specific structure of the double-gate transistor is not limited.

At least part of the structure described in this embodiment can be combined with at least part of a structure described in any of the other embodiments.

(Embodiment 14)

An example in which the oxide semiconductor layer 310 is used as the other electrode of the capacitor or the other electrode of the display element is shown in any of the other embodiments. However, the oxide semiconductor layer 310 may be used as one electrode of the capacitor or one electrode of the display element.

In the case where the oxide semiconductor layer 310 is used as one electrode of the capacitor or one electrode of the display element, the oxide semiconductor layer 310 may be electrically connected to the transistor.

The oxide semiconductor layer 310 may be used as an electrode of an element except the capacitor and the display element (e.g., a memory element or a photocurrent conversion element).

In the case where the oxide semiconductor layer 310 is used as one electrode of the display element, the conductive layer 701 is not necessarily provided.

In the case where the oxide semiconductor layer 310 is used as an electrode of an element except the display element (e.g., a memory element or a photocurrent conversion element), the conductive layer 701 is not necessarily provided.

At least part of the structure described in this embodiment can be combined with at least part of a structure described in any of the other embodiments.

(Embodiment 15)

The semiconductor device is a device including an element having a semiconductor.

Examples of the element having a semiconductor include a transistor, a resistor, a capacitor, and a diode.

It is preferable to use a field-effect transistor as the transistor, but the transistor is not limited thereto.

It is preferable to use a thin film transistor as the transistor, but the transistor is not limited thereto.

Examples of the semiconductor device include a display device including a display element, a memory device including a memory element, an RFID, and a processor, but the semiconductor device is not limited to these examples.

Examples of the display device include a liquid crystal display device including a liquid crystal element, an EL display device including an EL element, and an electrophoresis display device including an electrophoresis element, but the display device is not limited to these examples.

A liquid crystal display device is mainly described in any of the other embodiments, but the oxide semiconductor layer 310 can be used for any semiconductor device.

At least part of the structure described in this embodiment can be combined with at least part of a structure described in any of the other embodiments.

This application is based on Japanese Patent Application serial no. 2012-206461 filed with Japan Patent Office on Sep. 20, 2012, the entire contents of which are hereby incorporated by reference.

What is claimed is:

1. A semiconductor device comprising:
a first conductive layer and a second conductive layer over an insulating surface;
a first insulating layer over the first conductive layer and the second conductive layer;
a first oxide semiconductor layer and a second oxide semiconductor layer over the first insulating layer;
a third conductive layer and a fourth conductive layer over the first oxide semiconductor layer;
a second insulating layer over the third conductive layer and the fourth conductive layer; and
a fifth conductive layer over the second insulating layer;
wherein the third conductive layer is electrically connected to the second conductive layer,
wherein the fifth conductive layer is electrically connected to the fourth conductive layer,
wherein at least part of the first conductive layer has a function as a gate electrode of a transistor,
wherein at least part of the third conductive layer has a function as one of a source electrode and a drain electrode of the transistor,
wherein at least part of the fourth conductive layer has a function as the other of the source electrode and the drain electrode of the transistor,
wherein the first oxide semiconductor layer has a region overlapping with the first conductive layer,
wherein the second oxide semiconductor layer has a region overlapping with the fifth conductive layer, and
wherein the second oxide semiconductor layer has a region intersecting with the second conductive layer.

2. The semiconductor device according to claim 1, wherein an alkali metal concentration of the second oxide semiconductor layer is higher than an alkali metal concentration of the first oxide semiconductor layer.

3. The semiconductor device according to claim 1, wherein an alkaline earth metal concentration of the second oxide semiconductor layer is higher than an alkaline earth metal concentration of the second oxide semiconductor layer.

4. The semiconductor device according to claim 1, wherein a hydrogen concentration of the second oxide semiconductor layer is higher than a hydrogen concentration of the first oxide semiconductor layer.

5. The semiconductor device according to claim 1, wherein at least part of the fifth conductive layer has a function as one electrode of a display element,
wherein at least part of the fifth conductive layer has a function as one electrode of a capacitor,
wherein at least part of the second oxide semiconductor layer has a function as the other electrode of the display element, and
wherein at least part of the second oxide semiconductor layer has a function as the other electrode of the capacitor.

6. A semiconductor device comprising:
a first conductive layer and a second conductive layer over an insulating surface;
a first insulating layer over the first conductive layer and the second conductive layer;
a first oxide semiconductor layer and a second oxide semiconductor layer over the first insulating layer;
a third conductive layer and a fourth conductive layer over the first oxide semiconductor layer;
a sixth conductive layer over the second oxide semiconductor layer;
a second insulating layer over the third conductive layer, the fourth conductive layer, and the sixth conductive layer; and
a fifth conductive layer over the second insulating layer;
wherein the third conductive layer is electrically connected to the second conductive layer,
wherein the fifth conductive layer is electrically connected to the fourth conductive layer,
wherein at least part of the first conductive layer has a function as a gate electrode of a transistor,
wherein at least part of the third conductive layer has a function as one of a source electrode and a drain electrode of the transistor,
wherein at least part of the fourth conductive layer has a function as the other of the source electrode and the drain electrode of the transistor,
wherein at least part of the sixth conductive layer has a function as an auxiliary wiring,
wherein the first oxide semiconductor layer has a region overlapping with the first conductive layer,
wherein the second oxide semiconductor layer has a region overlapping with the fifth conductive layer, and
wherein the second oxide semiconductor layer has a region intersecting with the second conductive layer.

7. The semiconductor device according to claim 6, wherein an alkali metal concentration of the second oxide semiconductor layer is higher than an alkali metal concentration of the first oxide semiconductor layer.

8. The semiconductor device according to claim 6, wherein an alkaline earth metal concentration of the second oxide semiconductor layer is higher than an alkaline earth metal concentration of the second oxide semiconductor layer.

9. The semiconductor device according to claim 6, wherein a hydrogen concentration of the second oxide semiconductor layer is higher than a hydrogen concentration of the first oxide semiconductor layer.

10. The semiconductor device according to claim 6, wherein at least part of the fifth conductive layer has a function as one electrode of a display element,
wherein at least part of the fifth conductive layer has a function as one electrode of a capacitor,
wherein at least part of the second oxide semiconductor layer has a function as the other electrode of the display element, and
wherein at least part of the second oxide semiconductor layer has a function as the other electrode of the capacitor.

11. A semiconductor device comprising:
a first conductive layer over an insulating surface;
a first insulating layer over the first conductive layer;
a first oxide semiconductor layer and a second oxide semiconductor layer over the first insulating layer;
a third conductive layer and a fourth conductive layer over the first oxide semiconductor layer;

a second insulating layer over the third conductive layer and the fourth conductive layer; and
a fifth conductive layer over the second insulating layer;
wherein the fifth conductive layer is electrically connected to the fourth conductive layer,
wherein the first oxide semiconductor layer has a region overlapping with the first conductive layer, and
wherein the second oxide semiconductor layer has a region overlapping with the fifth conductive layer.

12. The semiconductor device according to claim 11, wherein an alkali metal concentration of the second oxide semiconductor layer is higher than an alkali metal concentration of the first oxide semiconductor layer.

13. The semiconductor device according to claim 11, wherein an alkaline earth metal concentration of the second oxide semiconductor layer is higher than an alkaline earth metal concentration of the second oxide semiconductor layer.

14. The semiconductor device according to claim 11, wherein a hydrogen concentration of the second oxide semiconductor layer is higher than a hydrogen concentration of the first oxide semiconductor layer.

15. The semiconductor device according to claim 11,
wherein at least part of the fifth conductive layer has a function as one electrode of a display element,
wherein at least part of the fifth conductive layer has a function as one electrode of a capacitor,
wherein at least part of the second oxide semiconductor layer has a function as the other electrode of the display element, and
wherein at least part of the second oxide semiconductor layer has a function as the other electrode of the capacitor.

* * * * *